(12) United States Patent
Muramatsu et al.

(10) Patent No.: US 9,084,372 B2
(45) Date of Patent: Jul. 14, 2015

(54) WIRING SUBSTRATE, LIGHT EMITTING DEVICE, AND MANUFACTURING METHOD OF WIRING SUBSTRATE

(71) Applicant: SHINKO ELECTRIC INDUSTRIES CO., LTD., Nagano-shi, Nagano (JP)

(72) Inventors: Shigetsugu Muramatsu, Nagano (JP); Hiroshi Shimizu, Nagano (JP); Yasuyoshi Horikawa, Nagano (JP)

(73) Assignee: SHINKO ELECTRIC INDUSTRIES CO., LTD., Nagano-shi, Nagano (JP)

( * ) Notice: Subject to any disclaimer, the term of this patent is extended or adjusted under 35 U.S.C. 154(b) by 346 days.

(21) Appl. No.: 13/749,070

(22) Filed: Jan. 24, 2013

(65) Prior Publication Data

US 2013/0188361 A1 Jul. 25, 2013

(30) Foreign Application Priority Data

Jan. 25, 2012 (JP) ................. 2012-013243

(51) Int. Cl.
*H05K 7/00* (2006.01)
*F21V 7/00* (2006.01)
(Continued)

(52) U.S. Cl.
CPC ............. *H05K 7/2039* (2013.01); *F21K 9/90* (2013.01); *F21V 7/00* (2013.01); *H05K 1/0274* (2013.01);
(Continued)

(58) Field of Classification Search
CPC ..... H05K 7/2039; H05K 3/46; H05K 1/0274; H05K 1/056; H05K 2201/0191; H05K 2201/09409; H05K 2201/099; H05K 2201/10106; H05K 2201/2054; H05K 3/3452; F21V 7/00; F21K 9/90; H01L 2224/16225

USPC ............ 362/296.01, 296.07, 297, 308, 309, 362/720, 760, 767, 783; 205/125, 118; 174/520, 521, 548, 252, 260
See application file for complete search history.

(56) References Cited

U.S. PATENT DOCUMENTS

| 3,152,938 A | 10/1964 | Osifchin et al. |
| 2003/0178227 A1 | 9/2003 | Matsunaga et al. |

(Continued)

FOREIGN PATENT DOCUMENTS

| EP | 0 989 610 A2 | 3/2000 |
| EP | 1 261 028 A2 | 11/2002 |

(Continued)

OTHER PUBLICATIONS

U.S. Appl. No. 13/748,903, Shinko Electric Industries Co., Ltd.
(Continued)

*Primary Examiner* — Hoa C Nguyen
(74) *Attorney, Agent, or Firm* — Drinker Biddle & Reath LLP

(57) ABSTRACT

There is provided a wiring substrate. The wiring substrate includes: a heat sink; an insulating layer on the heat sink; first and second wiring patterns on the insulating layer to be separated from each other at a certain interval; a first reflective layer including a first opening on the insulating layer so as to cover the first and second wiring patterns, wherein a portion of the first and second wiring patterns is exposed from the first opening, and wherein the portion of the first and second wiring patterns is defined as a mounting region on which a light emitting element is to be mounted; and a second reflective layer on the insulating layer, wherein the second reflective layer is interposed between the first and second wiring patterns. A thickness of the second reflective layer is smaller than that of the first reflective layer.

12 Claims, 21 Drawing Sheets

(51) Int. Cl.
*C25D 5/02* (2006.01)
*H05K 7/20* (2006.01)
*H05K 3/46* (2006.01)
*F21K 99/00* (2010.01)
*H05K 1/02* (2006.01)
*H05K 1/05* (2006.01)
*H05K 3/34* (2006.01)

(52) U.S. Cl.
CPC .................. *H05K 1/056* (2013.01); *H05K 3/46* (2013.01); *H01L 2224/16225* (2013.01); *H05K 3/3452* (2013.01); *H05K 2201/0191* (2013.01); *H05K 2201/099* (2013.01); *H05K 2201/09409* (2013.01); *H05K 2201/10106* (2013.01); *H05K 2201/2054* (2013.01)

(56) References Cited

U.S. PATENT DOCUMENTS

| | | |
|---|---|---|
| 2006/0012991 A1 | 1/2006 | Weaver, Jr. et al. |
| 2009/0103005 A1* | 4/2009 | Nakazato et al. ............... 349/62 |
| 2009/0161343 A1 | 6/2009 | Park et al. |
| 2009/0178828 A1 | 7/2009 | Tsumura et al. |
| 2011/0132644 A1 | 6/2011 | Nishi et al. |
| 2011/0278624 A1* | 11/2011 | Nam ............................... 257/98 |
| 2012/0044669 A1* | 2/2012 | Ogata et al. ................... 362/97.3 |
| 2012/0161163 A1* | 6/2012 | Kim ................................ 257/88 |
| 2012/0320601 A1* | 12/2012 | Motoya et al. ............ 362/296.01 |

FOREIGN PATENT DOCUMENTS

| | | |
|---|---|---|
| EP | 2 455 991 A1 | 5/2012 |
| JP | H05-218606 A | 8/1993 |
| JP | 2003-092011 A | 3/2003 |
| WO | WO 2011/007874 A1 | 1/2011 |

OTHER PUBLICATIONS

U.S. Appl. No. 13/749,096, Shinko Electric Industries Co., Ltd.

* cited by examiner

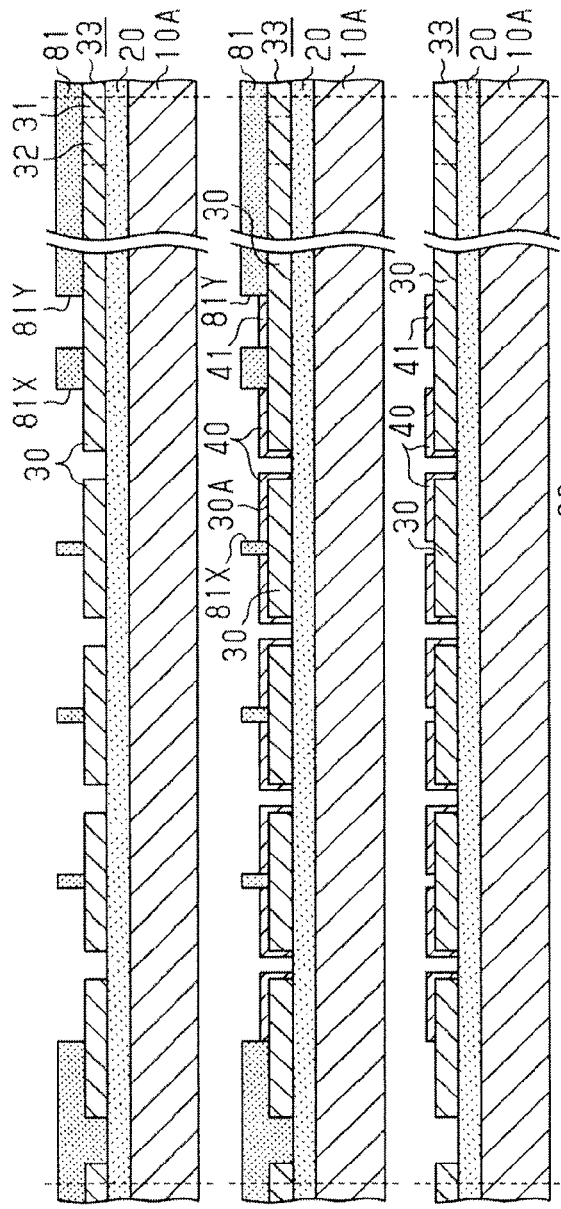
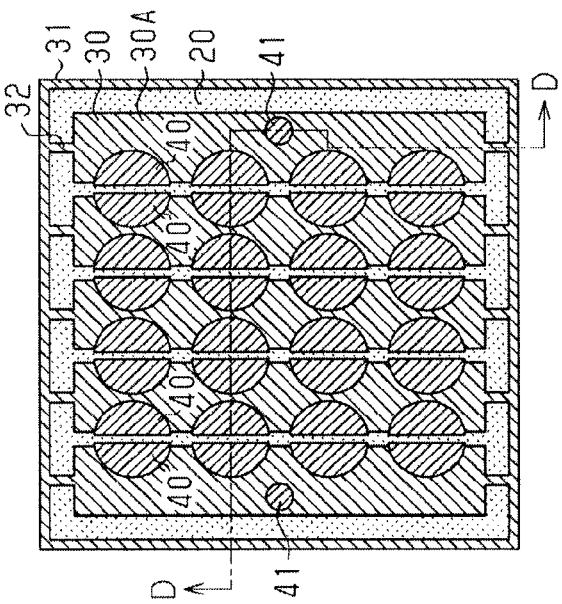
FIG. 6A
FIG. 6B
FIG. 6C
FIG. 6D

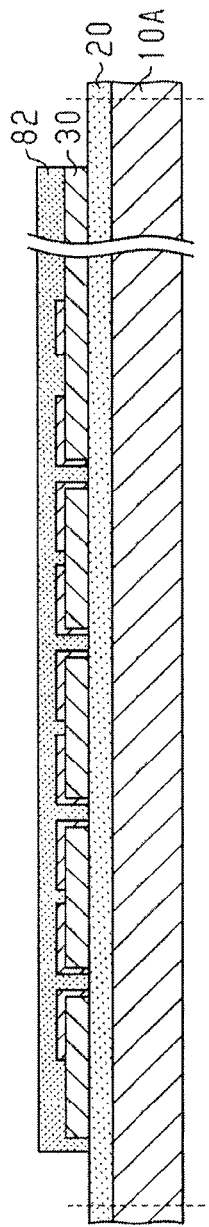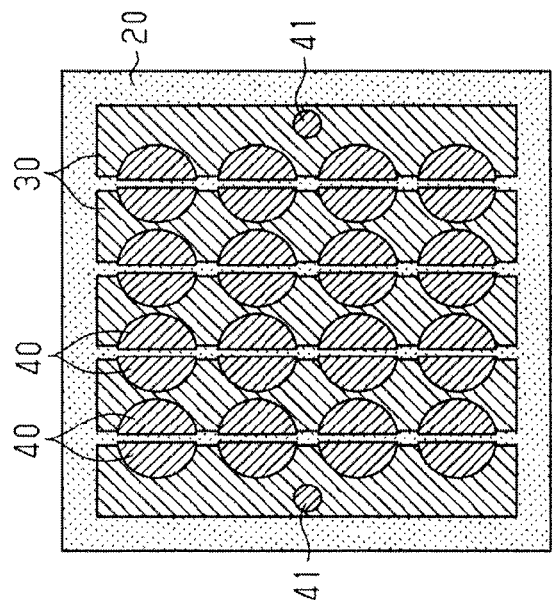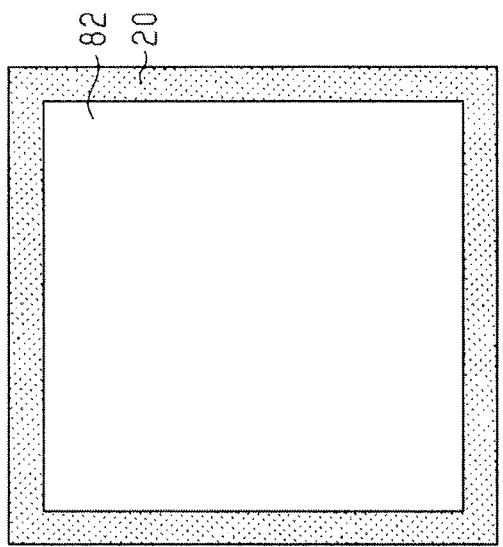

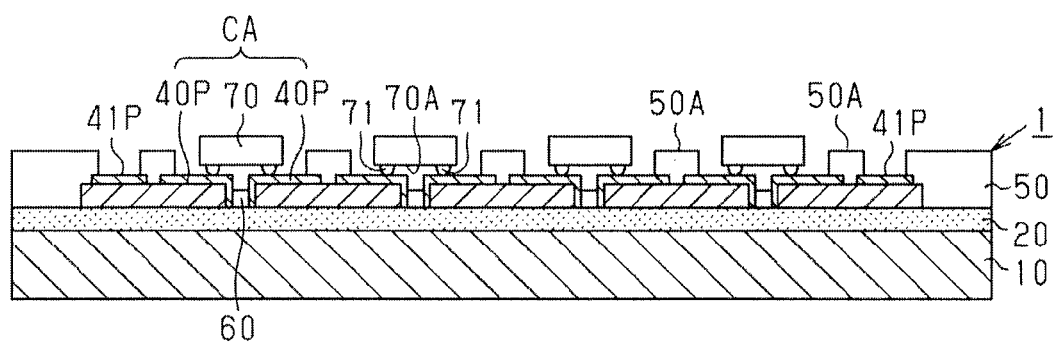
FIG. 17A
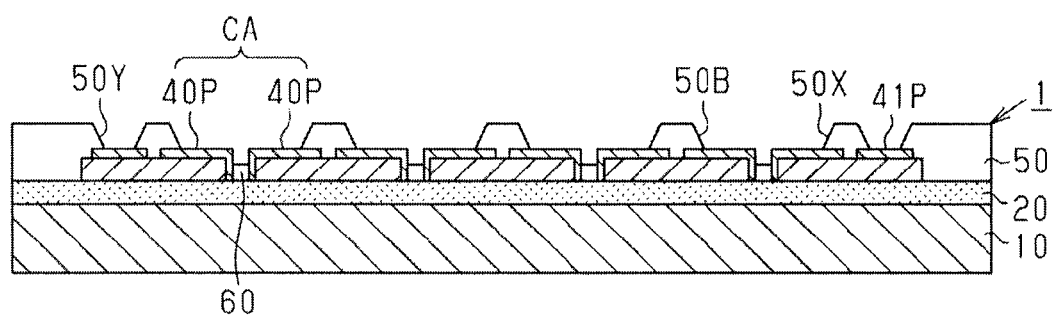
FIG. 17B
FIG. 18
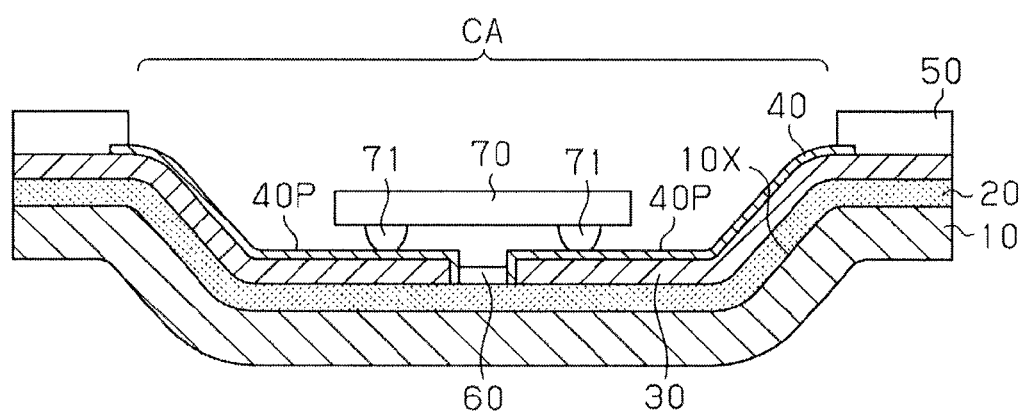

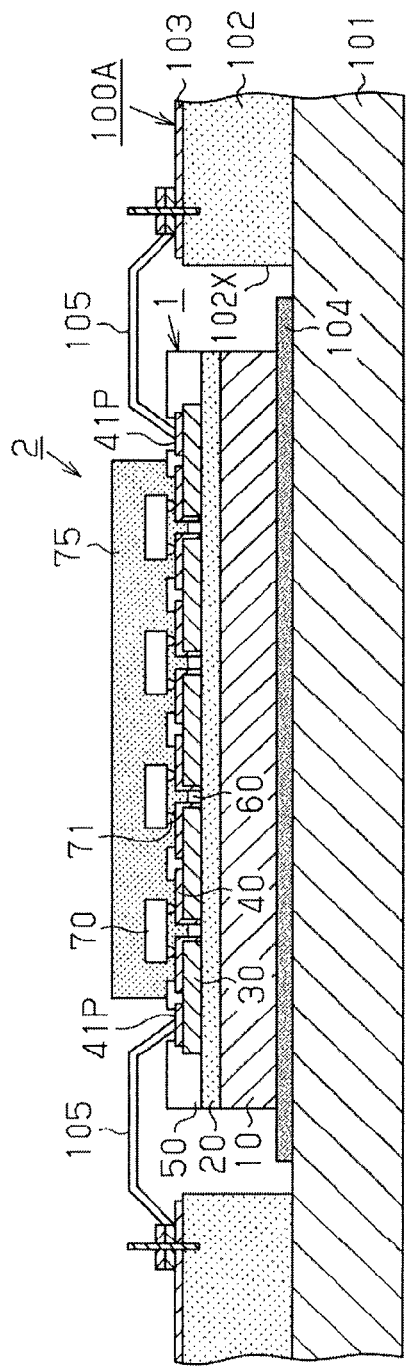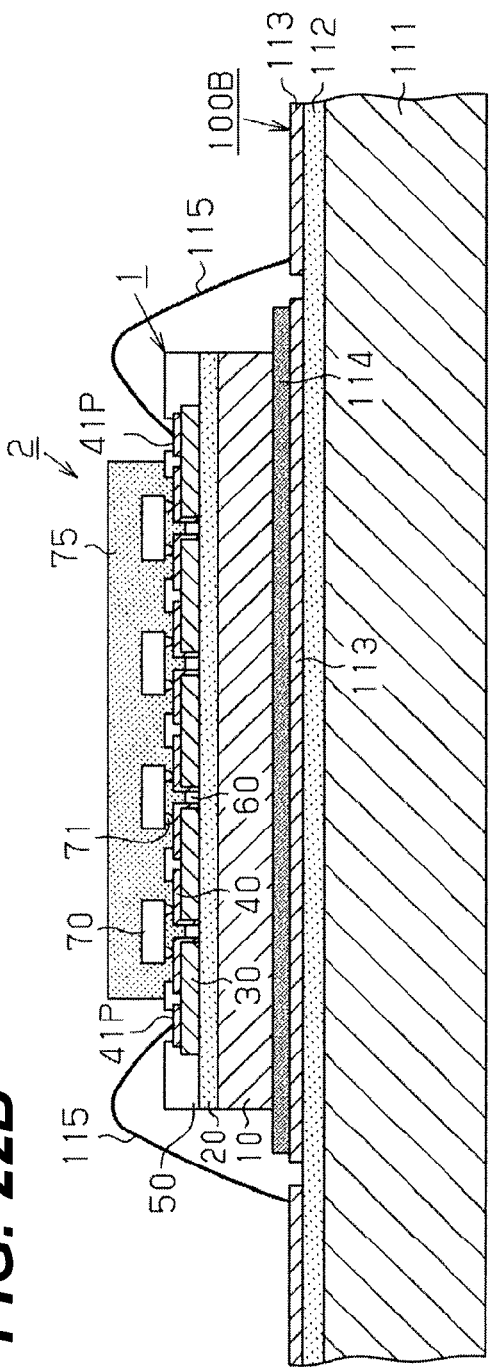

WIRING SUBSTRATE, LIGHT EMITTING DEVICE, AND MANUFACTURING METHOD OF WIRING SUBSTRATE

This application claims priority from Japanese Patent Application No. 2012-013243, filed on Jan. 25, 2012, the entire contents of which are herein incorporated by reference.

BACKGROUND

1. Technical Field

The present disclosure relates to a wiring substrate, a light emitting device, and a manufacturing method of the wiring substrate.

2. Description of the Related Art

In the related art, various shapes of light emitting devices in which light emitting elements are mounted on a substrate, have been proposed. As this kind of light emitting device, a structure is known in which wiring layers are formed on an insulating layer formed on a substrate made of metal, and a light emitting element such as a light emitting diode (LED) is mounted on the wiring layers (for example, see JP-A-2003-092011).

Here, in the light emitting device, in order to efficiently use light emitted by the light emitting element, a reflective layer having high reflectance is formed on an element mounting surface. The higher the reflective layer is formed to be, the greater the extent to which the reflectance of light from the light emitting element can be increased. However, when the reflective layer is formed to be high, there is a problem in that the reflective layer and the light emitting element tend to interfere (contact) with each other.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

According to one or more illustrative aspects of the present invention, there is provided a wiring substrate. The wiring substrate includes: a heat sink; an insulating layer on the heat sink; first and second wiring patterns on the insulating layer to be separated from each other at a certain interval; a first reflective layer including a first opening on the insulating layer so as to cover the first and second wiring patterns, wherein a portion of the first and second wiring patterns is exposed from the first opening, and wherein the portion of the first and second wiring patterns is defined as a mounting region on which a light emitting element is to be mounted; and a second reflective layer on the insulating layer, wherein the second reflective layer is interposed between the first and second wiring patterns. A thickness of the second reflective layer is smaller than that of the first reflective layer.

According to the aspect of the present invention, it is possible to achieve an effect of suppressing interference between the reflective layer and the light emitting element.

Other aspects and advantages of the present invention will be apparent from the following description, the drawings and the claims.

BRIEF DESCRIPTION OF THE DRAWINGS

FIG. 5D is a schematic plan view illustrating the manufacturing steps of the wiring substrate according to the embodiment, wherein FIGS. 5A to 5C show a cross-sectional view of the wiring substrate taken along the line C-C position of FIG. 5D;

FIGS. 6A to 6C are schematic cross-sectional views illustrating the manufacturing steps of the wiring substrate according to the embodiment;

FIG. 6D is a schematic plan view illustrating the manufacturing steps of the wiring substrate according to the embodiment, wherein FIGS. 6A to 6C show a cross-sectional view of the wiring substrate taken along the line D-D position of FIG. 6D;

FIG. 7B is a schematic plan view illustrating the manufacturing step of the wiring substrate according to the embodiment, wherein FIG. 7A shows a cross-sectional view of the wiring substrate taken along the line E-E position of FIG. 7B;

FIG. 8A is a schematic cross-sectional view illustrating the manufacturing step of the wiring substrate according to the embodiment;

FIGS. 8B and 8C are schematic plan views illustrating the manufacturing steps of the wiring substrate according to the embodiment;

FIGS. 11A and 11B are schematic cross-sectional views illustrating the manufacturing steps of the wiring substrate according to the embodiment, wherein FIGS. 11A and 11B show a cross-sectional view of the wiring substrate taken along the line F-F position of FIG. 9A;

FIGS. 11C and 11D are schematic cross-sectional views illustrating manufacturing steps of a light emitting device according to the embodiment, wherein FIGS. 11C and 11D show a cross-sectional view of the light emitting device taken along the line B-B position of FIG. 3A;

FIG. 12B is a schematic cross-sectional view illustrating the manufacturing step of the wiring substrate according to the modified example, wherein FIG. 12B shows a cross-sectional view of the wiring substrate taken along the line F-F position of FIG. 9A;

FIGS. 13A to 13D are schematic cross-sectional views illustrating manufacturing steps of a wiring substrate according to a modified example of the embodiment, wherein FIGS. 13A to 13D show a cross-sectional view of the wiring substrate taken along the line F-F position of FIG. 9A;

FIGS. 14A to 14D are schematic cross-sectional views illustrating manufacturing steps of a wiring substrate and a light emitting device according to a modified example of the embodiment, wherein FIGS. 14A to 14D show a cross-sectional view of the wiring substrate and the light emitting device taken along the line F-F position of FIG. 9A;

FIGS. 17A and 17B are schematic cross-sectional views illustrating a wiring substrate according to a modified example of the embodiment;

FIG. 18 is a schematic cross-sectional view illustrating a light emitting device according to a modified example of the embodiment;

FIGS. 22A and 22B are schematic cross-sectional views illustrating a mounting example of the light emitting device.

DETAILED DESCRIPTION OF EXEMPLARY EMBODIMENTS

Figure 1A:
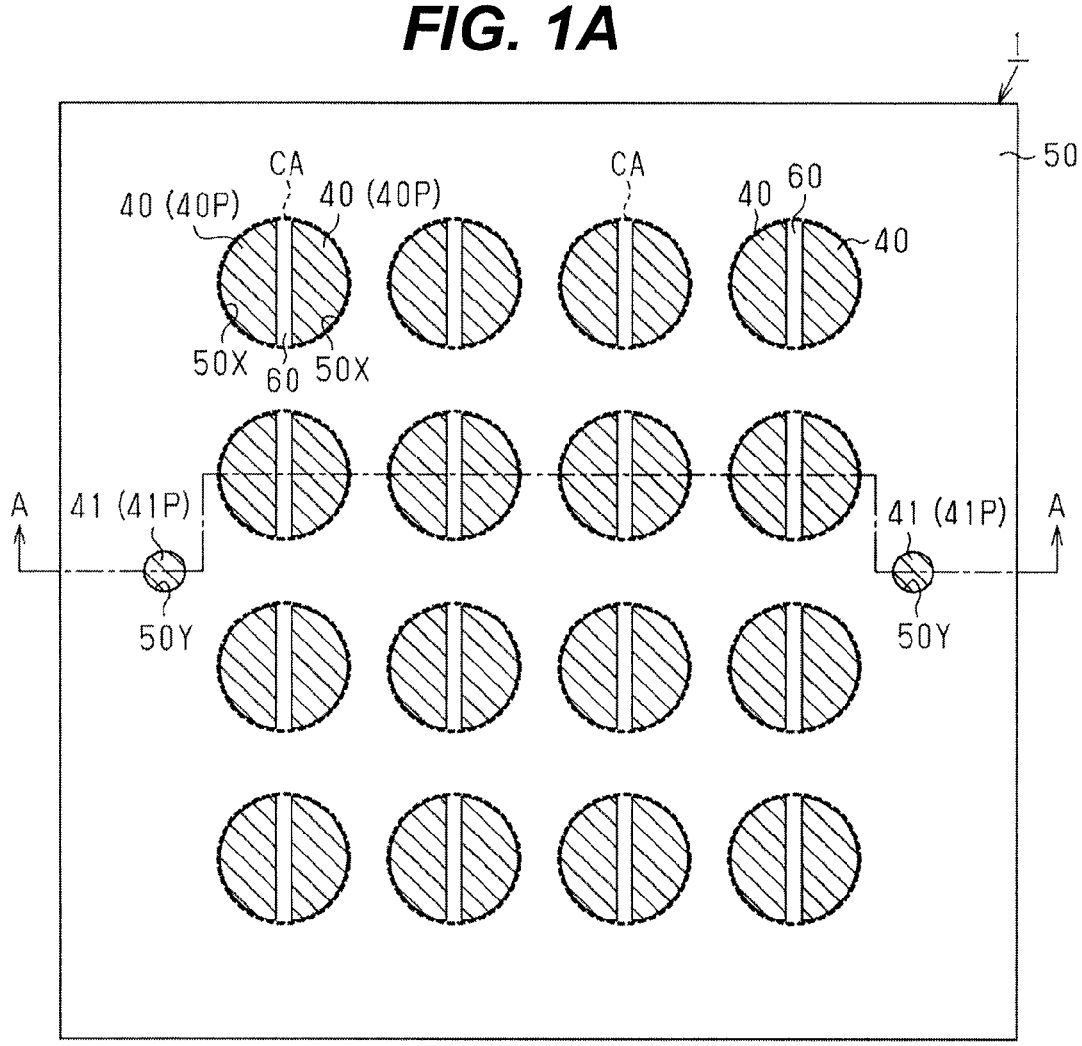
FIG. 1A is a schematic plan view illustrating a wiring substrate according to an embodiment.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

In addition, for convenience, in the accompanying drawings, there are cases in which featured portions are shown appropriately enlarged to easily understand features thereof, and the dimensions of each constituent element may be different from practical dimensions thereof. Further, in a cross-sectional view, hatching of some members is omitted in order to easily understand a cross-sectional view of each member.

An Embodiment

Hereinafter, an embodiment will be described with reference to FIGS. 1 to 11.

Structure of Wiring Substrate

Figure 1B:
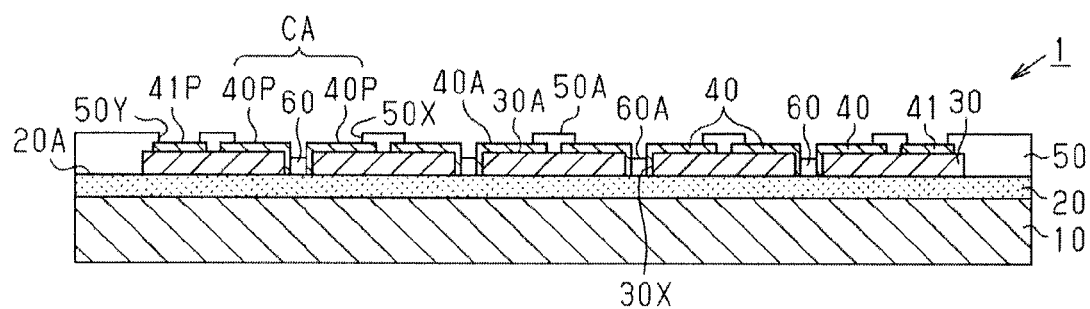
FIG. 1B is a schematic cross-sectional view taken along the line A-A of the wiring substrate shown in FIG. 1A.

As shown in FIG. 1B, a wiring substrate 1 includes a heat sink 10, an insulating layer 20 covering the upper surface of the heat sink 10, wiring patterns 30 formed on the insulating layer 20, metal layers 40 and 41 formed on the wiring patterns 30, a first reflective layer 50 covering the wiring patterns 30 and the like, and a second reflective layer 60 formed between the wiring patterns 30. This wiring substrate 1 is a wiring substrate applied to, for example, a light emitting device.

The heat sink 10 is, for example, an approximately rectangular thin plate in plan view. As a material of the heat sink 10, for example, a metal with favorable heat conductivity such as copper (Cu) or aluminum (Al), or an alloy including at least one of these metals may be used. In addition, as a material of the heat sink 10, for example, a ceramic material with favorable heat conductivity such as aluminum nitride or alumina may be used. The thickness of the heat sink 10 may be, for example, about 0.5 mm to 1.0 mm.

The insulating layer 20 is formed so as to cover the entire upper surface of the heat sink 10. As a material of the insulating layer 20, for example, an insulating resin with high heat conductivity (for example, about 1 W/mK to 10 W/mK) may be used. Specifically, as a material of the insulating layer 20, for example, an insulating resin such as a polyimide resin or an epoxy resin, or a resin material where a filler such as silica or alumina is mixed with the resin may be used. The thickness of the insulating layer 20 may be, for example, about 50 μm to 80 μm. The insulating layer 20 has a function of insulating the heat sink 10 from the wiring patterns 30, and a function of adhering the heat sink 10 to the wiring patterns 30. Further, in a case where the insulating layer 20 has high insulation properties, the insulating layer 20 is preferably formed thinly from the viewpoint of heat dissipation.

Figure 2:
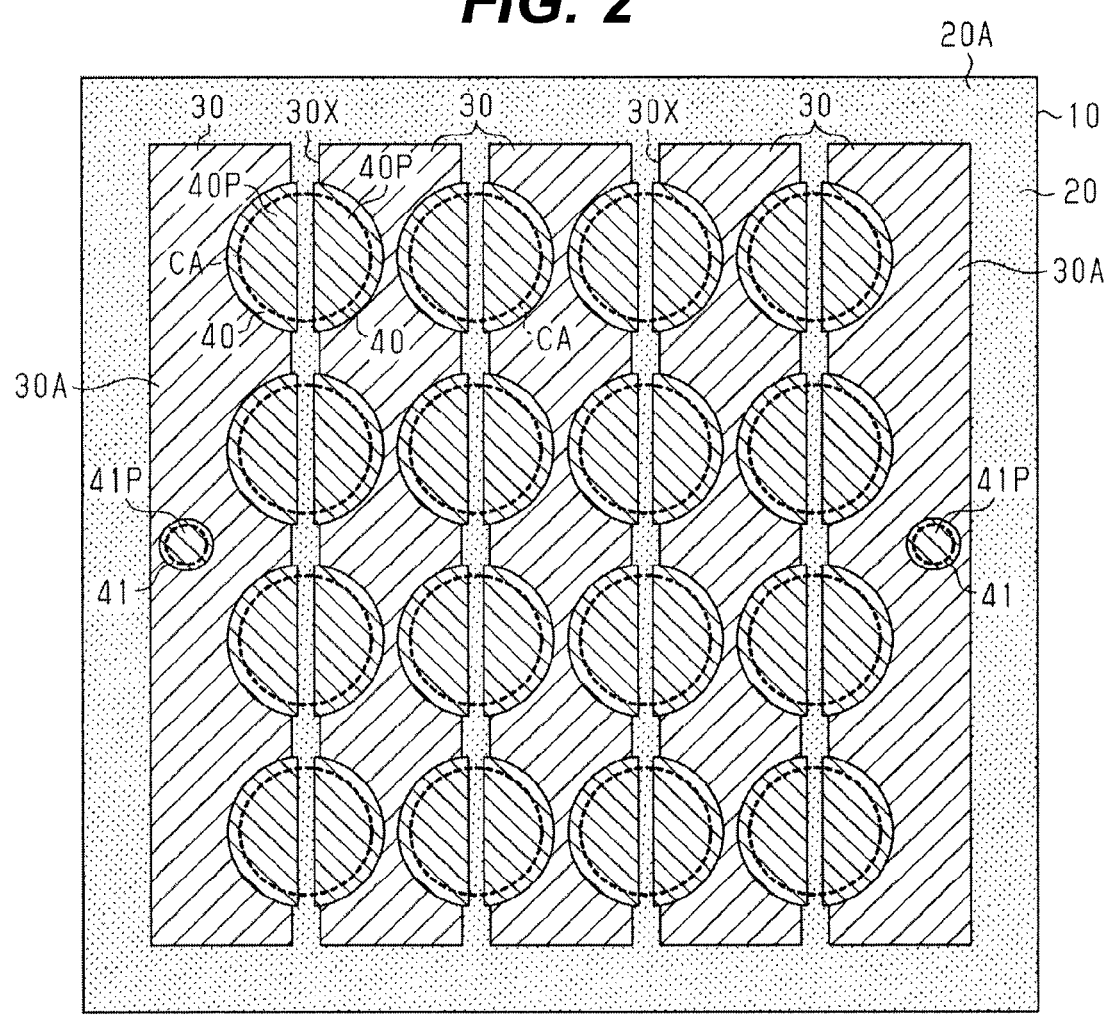
FIG. 2 is a schematic plan view illustrating a wiring pattern and a metal layer according to an embodiment.

The wiring patterns 30 are formed on the upper surface 20A of the insulating layer 20. The wiring patterns 30, as shown in FIG. 2, are formed so as to entirely cover the central portion of the upper surface 20A of the insulating layer 20. Specifically, a plurality of (in FIG. 2, five) wiring patterns 30 with a strip shape in plan view (a rectangular shape in plan view) are disposed in parallel so as to be adjacent to each other. In addition, a groove-shaped opening 30X which exposes the underlying insulating layer 20 is formed between the adjacent wiring patterns 30. A plurality of wiring patterns 30 are separated from each other by this opening 30X. Further, as a material of the wiring patterns 30, for example, copper or a copper alloy may be used. The thickness of the wiring pattern 30 may be, for example, about 35 μm to 105 μm. In addition, the distance between the adjacent wiring patterns 30 (the width of the opening 30X) may be, for example, about 0.1 mm to 0.3 mm.

A plurality of metal layers 40 with a semi-circular shape in plan view are formed on the upper surfaces 30A of the wiring patterns 30. These metal layers 40 are formed such that two metal layers 40 of which She straight lines of the semicircles face each other with the opening 30X interposed therebetween form a set (a pair). In other words, a pair of metal layers 40 are formed on the upper surfaces 30A of different wiring patterns 30 and are formed so as to have an approximately circular shape in plan view as a whole. In addition, such a pair of metal layers 40 are formed in a matrix (in FIG. 2, 4×4) on the wiring patterns 30. Each of the metal layers 40 has a pad 40P to which a light emitting element 70 (refer to FIG. 3) is bonded. Further, as shown in FIG. 1B, each of the metal layers 40 is formed so as to cover the side surface of the wiring pattern 30 in the opening 30X. An example of the metal layer 40 may include a silver (Ag) layer, a nickel (Ni)/gold (Au) layer (a metal layer where an Ni layer and an Au layer are formed in this order), an Ni/Ag layer (a metal layer where an Ni layer and an Ag layer are formed in this order), an Ni/palladium (Pd)/Au layer (a metal layer where an Ni layer, a Pd layer, and an Au layer are formed in this order), or the like. Further, an example of the metal layer 40 may include an Ni/Pd/Ag layer (a metal layer where an Ni layer, a Pd layer, and an Ag layer are formed in this order), an Ni/Pd/Ag/Au layer (an Ni layer, a Pd layer, an Ag layer, and an Au layer are formed in this order), or the like. Furthermore, in a case where the metal layer 40 is, for example, an Ni/Au layer, the thickness of the Ni layer may be about 1 μm to 10 μm, and the thickness of the Au layer may be about 0.05 μm to 2 μm.

As shown in FIG. 2, a pair of metal layers 41 with an approximately circular shape in plan view are formed on the upper surfaces 30A of the wiring patterns 30. These metal layers 41 are formed on the upper surfaces 30A of the wiring patterns 30 to the outside of the metal layers 40. Specifically, a pair of metal layers 41 are formed on two wiring patterns 30 disposed at the outermost positions of the five wiring patterns 30 and are formed to the outside of the metal layers 40 formed on the two wiring patterns 30. Each of the metal layers 41 has an external connection terminal pad 41P which is supplied with power from an external device. An example of the metal layer 41 may include an Ag layer, an Ni/Au layer, an Ni/Ag layer, an Ni/Pd/Au layer, an Ni/Pd/Ag layer, an Ni/Pd/Ag/Au layer, or the like, in the same manner as the metal layer 40. In addition, in a case where the metal layer 41 is, for example, an Ni/Au layer, the thickness of the Ni layer may be about 1 μm to 10 μm, and the thickness of the Au layer may be about 0.05 μm to 2 μm.

As shown in FIG. 1B, the first reflective layer 50 is formed so as to cover a portion of the upper surfaces 30A of the wiring patterns 30, the upper surface 20A of the insulating layer 20, and the metal layers 40. The upper surfaces 30A of the wiring patterns 30 exposed from the metal layers 40 are covered with the first reflective layer 50.

The first reflective layer 50 is formed on the upper surfaces of the wiring patterns 30 or the wiring patterns 30 and the metal layers 40 and has an opening 50X (a first opening) which exposes a portion of the metal layers 40 and the insulating layer 20 as a light emitting element mounting region CA for mounting the light emitting element 70 (refer to FIG. 3) therein. In addition, the first reflective layer 50 is formed on the insulating layer 20 and is formed on the wiring pattern 30 disposed at the outmost side of a plurality of wiring patterns 30 and has an opening 50Y (a second opening) which exposes a part of the metal layer 41 as the external connection terminal pad 41 P. Specifically, as shown in FIG. 3, the light emitting element 70 is electrically mounted on the metal layers 40 in the opening 50X. Here, as shown in FIG. 1A, a planar shape of the light emitting element mounting region CA is formed, for example, in a circular shape. The light emitting element mounting regions CA are arranged in a matrix (in FIG. 1A, 4×4) on the wiring substrate 1. In each light emitting element mounting region CA, a portion of the metal layers 40 formed on the two wiring patterns 30 which are separated by the groove-shaped opening 30X are exposed from the opening 50X.

In addition, a planar shape of the opening 50Y is formed, for example, in a circular shape. Specifically, each opening 50Y is formed such that a planar shape thereof is smaller than a planar shape of the each metal layer 41. For this reason, a part of the metal layer 41 is exposed from the opening 50Y, and the exposed metal layer 41 functions as the external connection terminal pad 41 P. The external connection terminal pad 41P is supplied with power from an external power source via wires and the like on a mounting board. In addition, the thickness from the upper surface 20A of the insulating layer 20 to the upper surface 50A of the first reflective layer 50 may be, for example, about 50 μm to 150 μm. Further, the thickness from the upper surface 30A of the wiring pattern 30 to the upper surface 50A of the first reflective layer 50 may be, for example, about 20 μm to 50 μm.

The second reflective layer 60 is formed between the adjacent wiring patterns 30, specifically, so as to cover the insulating layer 20 which is exposed between the metal layers 40 covering the side surfaces of the wiring patterns 30 in the opening 30X. That is, the second reflective layer 60 is formed so as to cover the insulating layer 20 exposed in the opening 50X of the first reflective layer 50. A part of the side surface of the metal layer 40 is covered with the second reflective layer 60. In addition, the second reflective layer 60 is formed so as to be thinner than the first reflective layer 50. Specifically, the second reflective layer 60 is formed such that the upper surface 60A thereof is lower than the upper surface 50A of the first reflective layer 50. More specifically, the second reflective layer 60 is formed such that the upper surface 60A thereof is lower than the upper surface 40A of the metal layer 40. Further, the second reflective layer 60 is formed such that the upper surface 60A thereof is lower than the upper surface 30A of the wiring pattern 30. The thickness of the second reflective layer 60 (from the upper surface 20A of the insulating layer 20 to the upper surface 60A of the second reflective layer 60) may be, for example, about 30 μm to 100 μm.

These first and second reflective layers 50 and 60 have high reflectance. Specifically, the first and second reflective layers 50 and 60 have reflectance of 50% or more (preferably, 80% or more) between the wavelength 450 nm to 700 nm. The first and second reflective layers 50 and 60 are also referred to as white resist layers. As a material of the first and second reflective layers 50 and 60, for example, a white insulating resin may be used. As the white insulating resin, for example, a resin material where a filler or a pigment formed from white titanium oxide ($TiO_2$) or barium sulfate ($BaSO_4$) is contained in an epoxy resin, a silicon resin, or an organopolysiloxane resin may be used. The first and second reflective layers 50 and 60 (white resist layers) cover the outermost surface of the wiring substrate 1, and thereby it is possible to reduce light amount loss of light emitting elements by increasing the reflectance of light from the light emitting elements mounted on the wiring substrate 1 as well as protecting the wiring patterns 30.

Structure of Light Emitting Device

Next, a structure of a light emitting device 2 will be described.

Figure 3A:
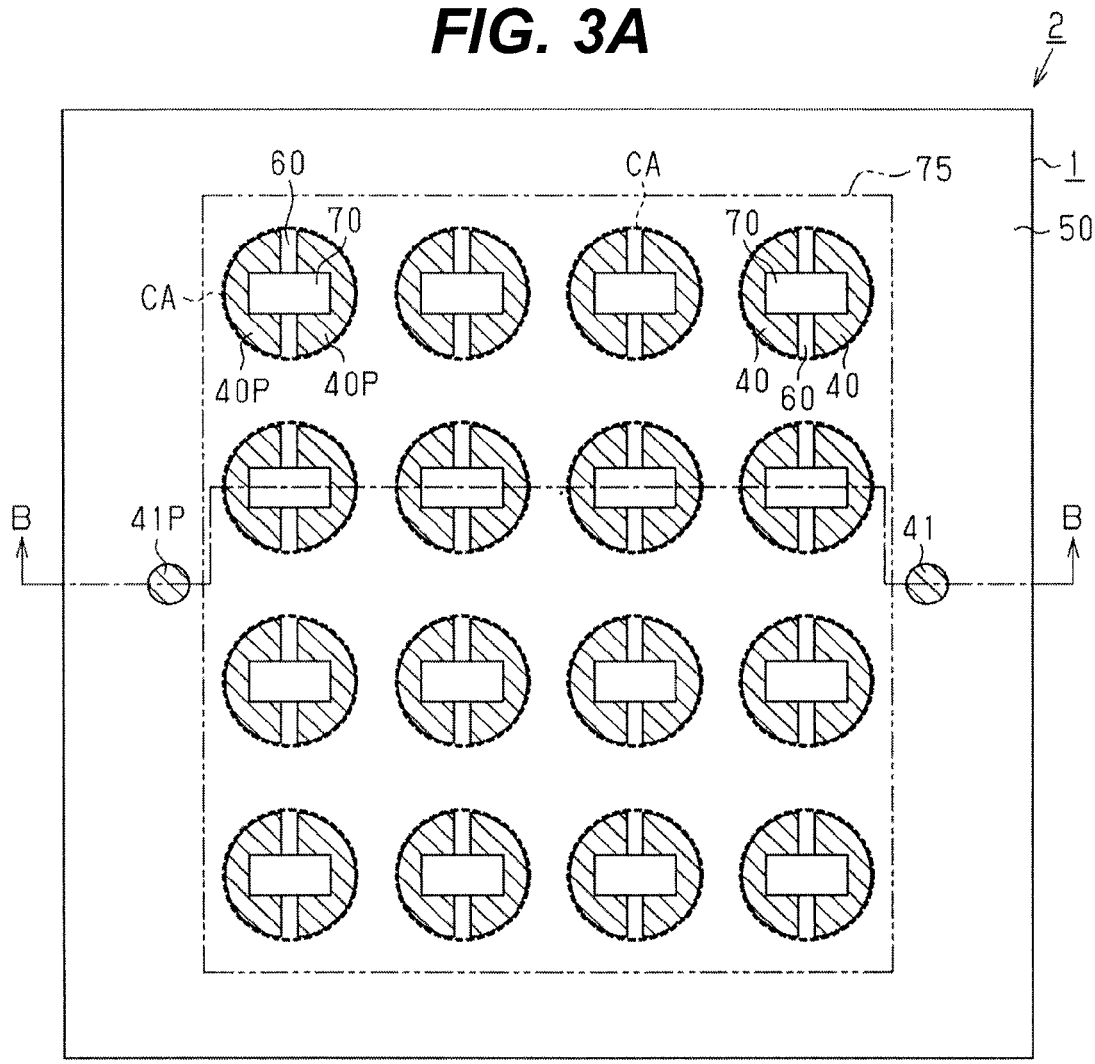
FIG. 3A is a schematic plan view illustrating a light emitting device according to an embodiment.
Figure 3B:
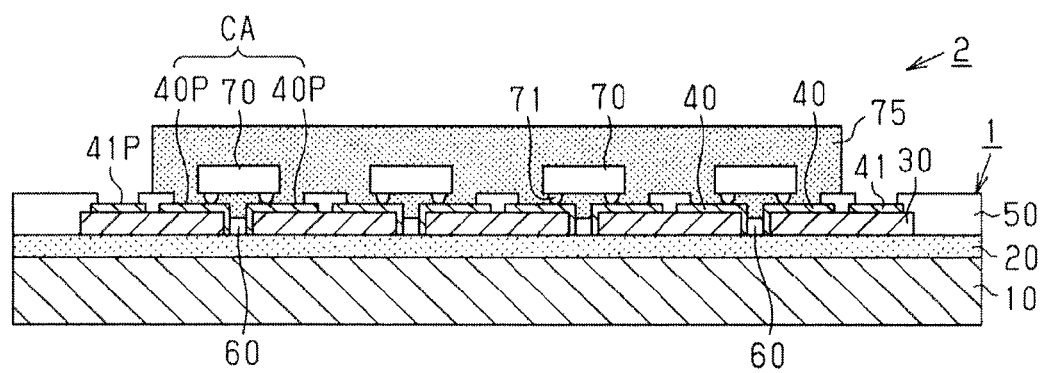
FIG. 3B is a schematic cross-sectional view taken along the line B-B of the light emitting device shown in FIG. 3A.

As shown in FIG. 3B, the light emitting device 2 includes the above-described wiring substrate 1, a plurality of (in FIG. 3A, sixteen) light emitting elements 70 mounted on the wiring substrate 1, and an encapsulating resin 75 which encapsulates the light emitting elements 70 and the like.

Each light emitting element 70 is mounted on a pair of pads 40P formed in each light emitting element mounting region CA. Specifically, each light emitting element 70 is flip-chip mounted on two pads 40P formed on both sides of the second reflective layer 60 so as to cross over the second reflective layer 60 formed between the pair of pads 40P, that is, the second reflective layer 60 formed in the opening 30X. More specifically, one bump 71 formed on one surface (the lower surface in FIG. 3B) of the light emitting element 70 is flip-chip bonded to one pad 40P of the two pads 40P, and the other bump 71 is flip-chip bonded to the other pad 40P. Thereby, each bump 71 of each light emitting element 70 is electrically connected to the wiring pattern 30 via the pad 40P. In addition, as shown in FIG. 3A, the light emitting elements 70 are arranged in a matrix (4×4 in FIG. 3A) on the wiring substrate 1. For this reason, in the light emitting device 2, between the pair of external connection terminal pads 41P, four light emitting elements 70 are connected in series, and four groups of the serially connected light emitting elements 70 are connected in parallel. In addition, the light emitting elements 70 are supplied with power from an external power source (not shown) via the metal layers 41 or the wiring patterns 30 and emit light. Further, a planar shape of the light emitting element 70 is formed, for example, in a rectangular shape, and the size thereof may be, for example, about 0.3 mm$^2$ to 0.5 mm$^2$. Furthermore, the height of the bump 71 may be, for example, about 30 μm to 100 μm.

As the light emitting element 70, for example, a light emitting diode (LED) or a vertical cavity surface emitting laser (VCSEL) may be used. As the bump 71, for example, a gold bump or a solder bump may be used. As a material of the solder bump, for example, an alloy including lead (Pb), an alloy of tin (Sn) and Au, an alloy of Sn and Cu, an alloy of Sn and Ag, an alloy of Sn, Ag and Cu, or the like may be used.

As shown in FIG. 3B, the encapsulating resin 75 is provided on the upper surface of the wiring substrate 1 so as to encapsulate the light emitting elements 70, the bumps 71, and the like. As a material of the encapsulating resin 75, for example, a resin material where a fluorescent substance is contained in a silicon resin may be used. The resin material containing the fluorescent substance is formed on the light emitting elements 70, thus a mixed color of emission of the light emitting element 70 and emission of the fluorescent substance can be used, and thereby it is possible to control various emission colors of the light emitting device 2.

Operation

In the wiring substrate 1 according to the present embodiment, the second reflective layer 60 formed between the pads 40P is formed so as to be lower than the first reflective layer 50. Thereby, since the second reflective layer 60 which may interfere with the light emitting element 70 is formed thinly, interference (contact) between the second reflective layer 60 and the light emitting element 70 is appropriately suppressed.

Manufacturing Method of Wiring Substrate

Next, a manufacturing method of the wiring substrate 1 will be described with reference to FIGS. 4 to 11.

Figure 4:
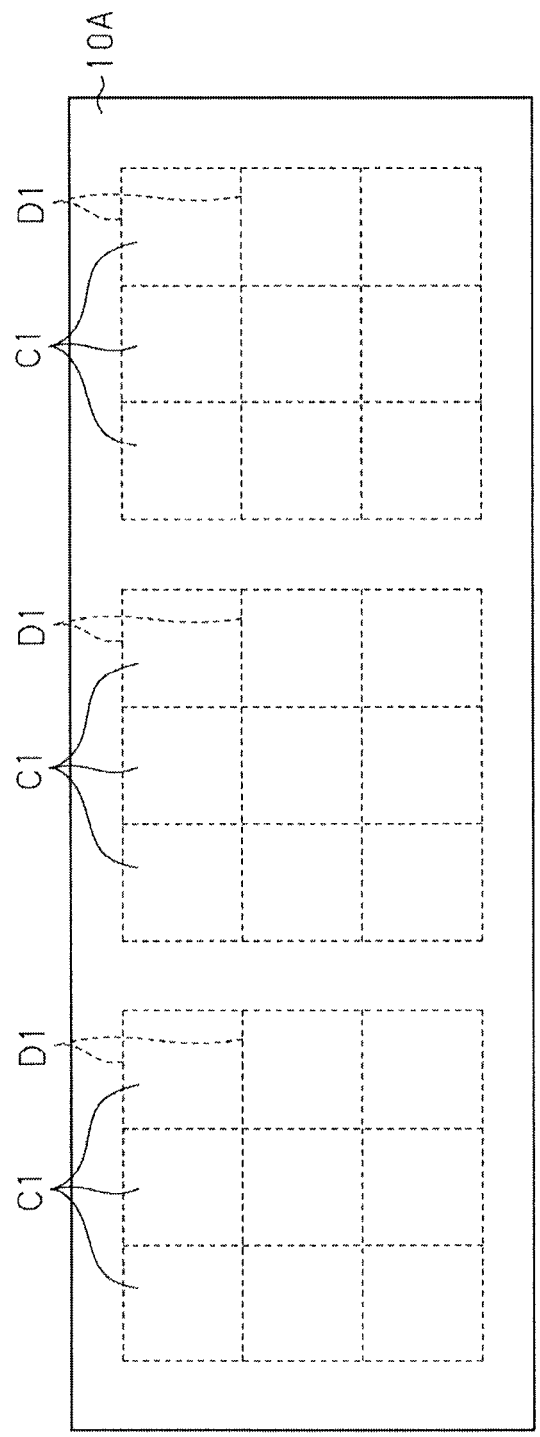
FIG. 4 is a schematic plan view illustrating a manufacturing method of the wiring substrate according to the embodiment.

First, in order to manufacture the wiring substrate 1, as shown in FIG. 4, a multi-piece substrate (hereinafter, also simply referred to as a "substrate") 10A is prepared. The substrate 10A has a plurality of partitions where (in FIG. 4, three) wiring substrate forming regions C1 which are regions in which the wiring substrate 1 is formed, are formed in a matrix (3×3 in FIG. 4). The substrate 10A is cut along the cutting lines D1 using a dicing blade or the like after a structure corresponding to the wiring substrate 1 is formed in the wiring substrate forming region C1. Thereby, the structure corresponding to the wiring substrate 1 is formed as a unit piece, and thereby a plurality of wiring substrates 1 are manufactured. At this time, in each wiring substrate 1, the substrate 10A becomes the heat sink 10 shown in FIG. 1. For this reason, as a material of the substrate 10A, in the same manner as the heat sink 10, a metal with favorable heat conductivity such as, for example, copper, aluminum, or iron, or an alloy including at least one of these metals may be used. In addition, for convenience of description, in FIGS. 5 to 11 described later, a structure of a single wiring substrate forming region C1 is shown.

Figure 5A:
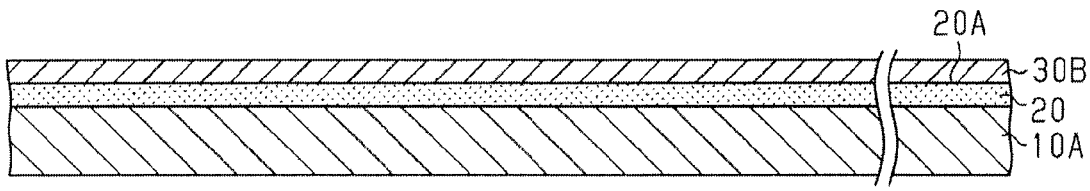
FIGS. 5A to 5C are schematic cross-sectional views illustrating manufacturing steps of the wiring substrate according to the embodiment.

Next, in the step shown in FIG. 5A, the insulating layer 20 is formed so as to cover the entire upper surface of the substrate 10A, and a copper foil 30B is formed so as to cover the entire upper surface 20A of the insulating layer 20. For example, a single-side copper-clad substrate having the copper foil 30B formed on a single surface of the insulating layer 20 (insulating substrate) is adhered to the substrate 10A, thereby forming the insulating layer 20 and the copper foil 30B on the substrate 10A. In addition, for example, an insulating resin film with a copper foil may be formed on the substrate 10A, thereby forming the insulating layer 20 and the copper foil 30B on the substrate 10A.

Figure 5B:
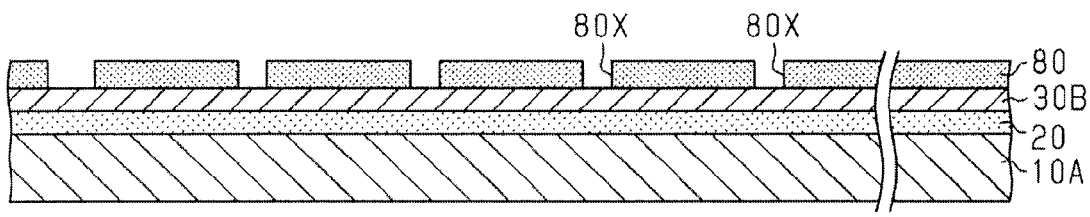

Next, in the step shown in FIG. 5B, a resist layer 80 having an opening 80X at a predetermined location is formed on the upper surface of the copper foil 30B. The resist layer 80 is formed so as to cover the copper foil 30B at portions corresponding to the necessary wiring patterns 30, a feed line 31 for plating power supply, and connection portions 32 (refers to FIGS. 5C and 5D). As a material of the resist layer 80, a etching resistant material may be used. Specifically, as a material of the resist layer 80, a photosensitive dry film resist, a liquid photoresist (for example, a dry film resist or a liquid resist of a Novolac resin, an acryl resin, or the like), and the like may be used. For example, in a case of using the photosensitive dry film resist, a dry film is formed on the upper surface of the copper foil 30B through thermocompression, and the dry film is patterned through exposure and development, thereby forming the resist layer 80. Further, in a case where the liquid photoresist is used as well, the resist layer 80 may be formed through the same steps.

Figure 5C:
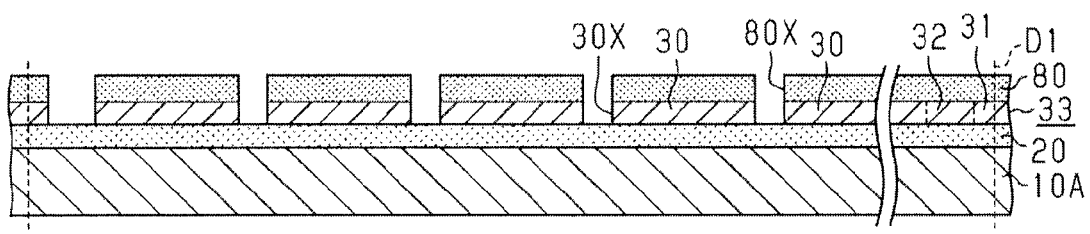
Figure 5D:
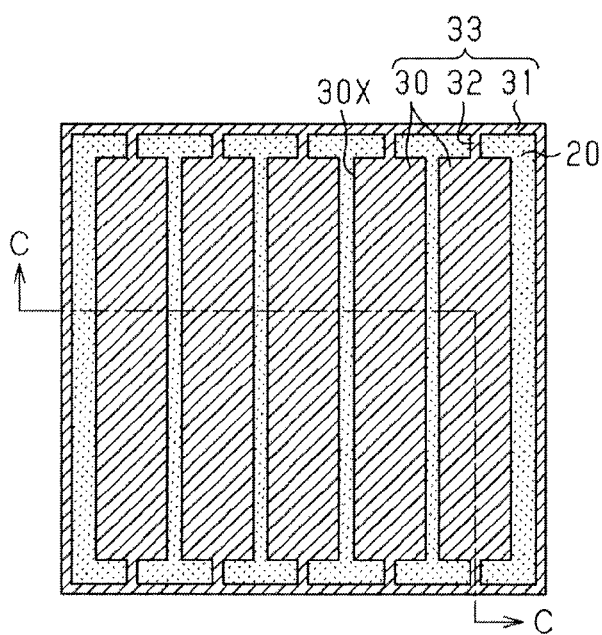

Next, in the step shown in FIG. 5C, the copper foil 30B is etched using the resist layer 80 shown in FIG. 5B as an etching mask, thereby patterning the copper foil 30B in a predetermined shape. Thereby, as shown in FIG. 5D, the necessary wiring patterns 30, the feed line 31, and the connection portions 32 are formed on the upper surface 20A of the insulating layer 20. Specifically, a plurality of strip-shaped wiring patterns 30 arranged in parallel, the feed line 31 formed in a frame shape in the outer circumferential region, and the connection portions 32 which electrically connect the feed line 31 and the wiring patterns 30 to each other, are formed. Thereby, all the wiring patterns 30 are electrically connected to the feed line 31 via the connection portions 32. In addition, the groove-shaped opening 30X is formed between the wiring patterns 30 through the etching. In this step, as an etchant, for example, a ferric chloride solution can be used, and thus the patterning can be performed from the upper surface side of the substrate 10A through spray etching. Further, in the following description, the wiring patterns 30, the feed line 31, and the connection portions 32 are also collectively referred to as wiring layers 33. FIG. 5D shows a state where the resist layer 80 shown in FIG. 5C is removed by, for example, an alkaline stripping agent after the patterning of the copper foil 30B is completed.

Next, in the step shown in FIG. 6A, a resist layer 81 having openings 81X and 81Y at predetermined locations is formed on the wiring patterns 30. The opening 81X is formed so as to expose a portion of the wiring pattern 30 corresponding to a region where the metal layer 40 is formed. In addition, the opening 81Y is formed so as to expose a portion of the wiring pattern 30 corresponding to a region where the metal layer 41 is formed. Further, the feed line 31 and the connection portions 32 are covered with the resist layer 81. As a material of the resist layer 81, a material having plating resistance may be used. Specifically, as a material of the resist layer 81, a photosensitive dry film resist, a liquid photoresist (for example, a dry film resist or a liquid resist of a Novolac resin, an acryl resin, or the like), or the like may be used.

Next, in the step shown in FIG. 6B, electrolytic plating where the wiring layers 33 are used as plating feed layers is performed on the surfaces (the upper surfaces and the side surfaces) of the wiring patterns 30 by using the resist layer 81 as a plating mask. Specifically, the electrolytic plating is performed on the upper surfaces 30A and the side surfaces of the wiring patterns 30 exposed from the openings 81X of the resist layer 81, thereby forming the metal layers 40. The metal layers 40 are formed so as to cover the upper surfaces 30A and the side surfaces of the wiring patterns 30 exposed from the opening 81X. In addition, the electrolytic plating is performed on the upper surfaces 30A of the wiring patterns 30 exposed from the opening 81Y of the resist layer 81, thereby forming the metal layers 41 on the wiring patterns 30. The metal layers 41 are formed so as to cover the upper surfaces 30A of the wiring patterns 30 exposed from the opening 81Y. In addition, for example, in a case where the metal layers 40 and 41 are Ni/Au layers, an Ni layer and an Au layer are formed in order on the surfaces of the wiring patterns 30 exposed from the openings 81X and 81Y of the resist layer 81 through the electrolytic plating method.

Next, in the step shown in FIG. 6C, the resist layer 81 shown in FIG. 6B is removed by, for example, an alkaline stripping agent. Thereby, as shown in FIG. 6D, a plurality of metal layers 40 with an approximately semi-circular shape in plan view are formed and a plurality of metal layers 41 with an approximately circular shape in plan view are formed on the upper surfaces 30A of the wiring patterns 30.

Figure 7A:
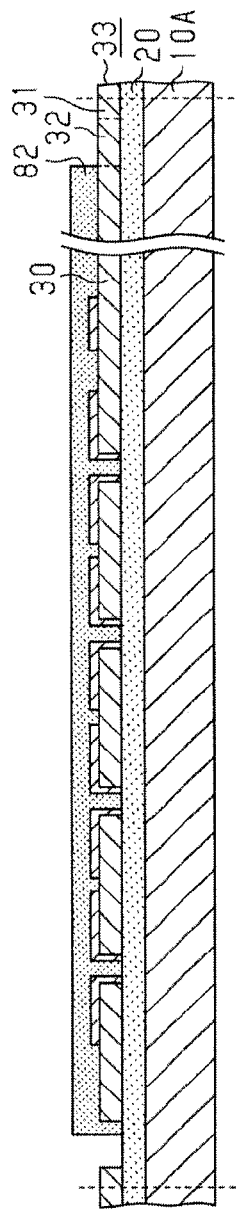
FIG. 7A is a schematic cross-sectional view illustrating the manufacturing step of the wiring substrate according to the embodiment.
Figure 7B:
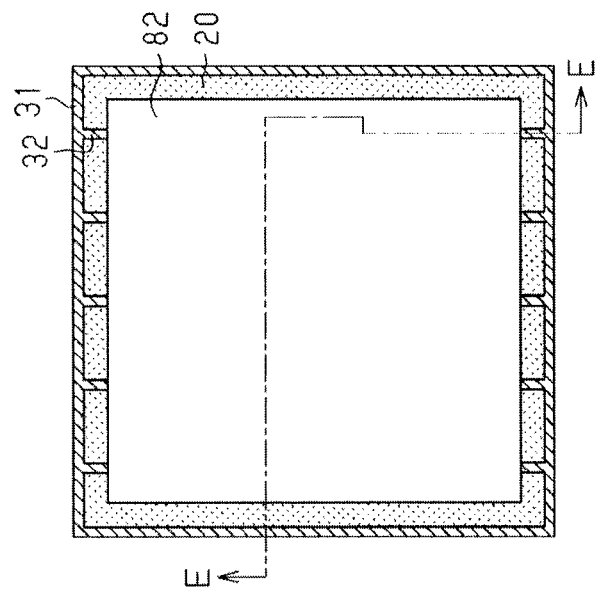

Next, in the step shown in FIGS. 7A and 7B, a resist layer 82 is formed on the insulating layer 20 and the wiring patterns 30 so as to cover the wiring patterns 30. The resist layer 82 is formed so as to expose the feed line 31 and the connection portions 32 and is formed so as to expose the insulating layer 20 which is formed to the outside of the wiring patterns 30. As a material of the resist layer 82, an etching resistant material may be used. Specifically, as a material of the resist layer 82, a photosensitive dry film resist, a liquid photoresist (for example, a dry film resist or a liquid resist of a Novolac resin, an acryl resin, or the like), or the like may be used.

Next, in the step shown in FIGS. 8A and 8B, the wiring layers 33 are etched using the resist layer 82 as an etching mask, thereby removing the feed line 31 and the connection portions 32. Thereby, as shown in FIG. 8C, a plurality of wiring patterns 30 are electrically separated from each other. In addition, in this step, as an etchant, for example, ferric chloride solution may be used, and the feed line 31 and the connection portions 32 can be removed from the upper surface side of the substrate 10A through spray etching. Subsequently, in the step shown in FIG. 8C, the resist layer 82 shown in FIG. 8B is removed by, for example, an alkaline stripping agent.

Figure 9A:
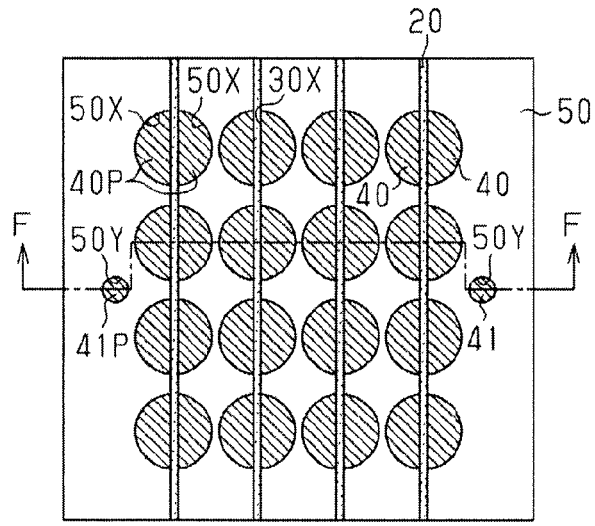
FIG. 9A is a schematic plan view illustrating the manufacturing step of the wiring substrate according to the embodiment.
Figure 9B:
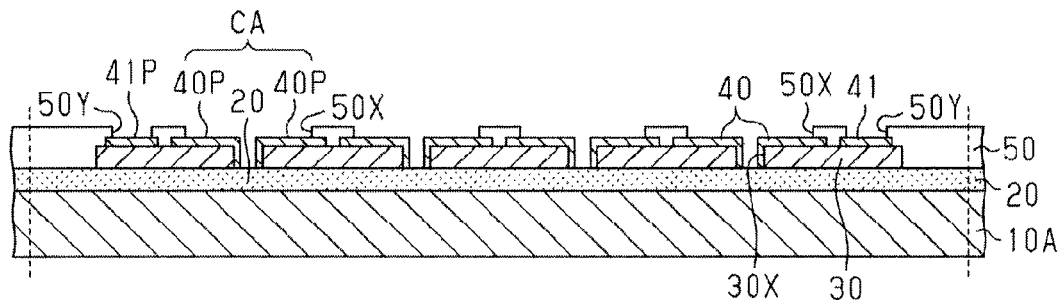
FIG. 9B is a schematic cross-sectional view illustrating the manufacturing step of the wiring substrate taken along the line F-F position of FIG. 9A.
Figure 9C:
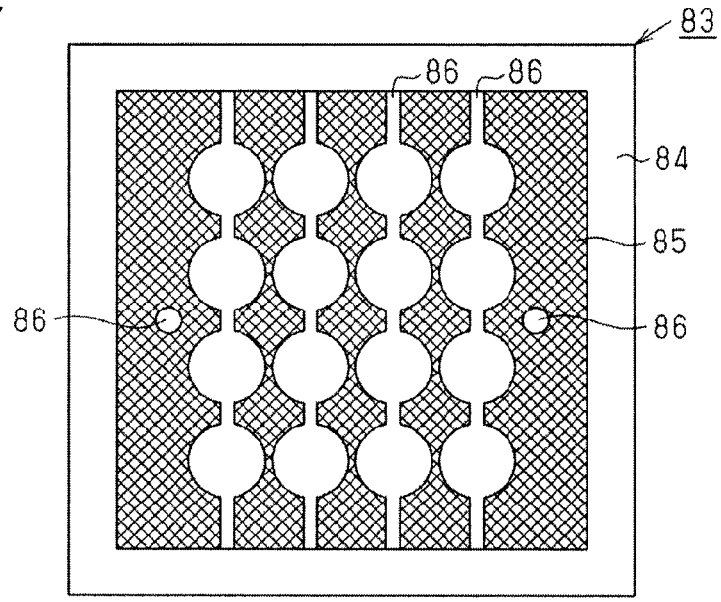
FIG. 9C is a schematic plan view illustrating a screen mask used for manufacturing the wiring substrate according to the embodiment.

Next, in the step shown in FIGS. 9A and 9B, the first reflective layer 50 having the openings 50X and 50Y is formed on the insulating layer 20 on the outside of the wiring patterns 30, the wiring patterns 30, and the metal layers 40 and 41. The opening 50X is formed so as to expose the metal layers 40 and the insulating layer 20 which will become the light emitting element mounting region CA, and is formed so as to expose a part of the insulating layer 20 exposed from the opening 30X. The metal layers 40 exposed from the opening 50X function as the pads 40P. In addition, the opening 50Y is formed so as to expose a portion of the metal layers 41 as the external connection terminal pads 41P. The first reflective layer 50 may be formed according to, for example, a screen printing method using a resin paste. Specifically, the screen printing method is performed using, for example, a screen mask 83 shown in FIG. 9C. In the screen mask 83, a metal mesh 85 is extended over a frame-shaped frame 84, and photosensitive resins 86 such as an emulsion are patterned in the metal mesh 85. The photosensitive resins 86 are provided at predetermined positions in a state of covering the metal mesh 85, and portions where the photosensitive resins 86 are not provided are openings corresponding to printing patterns. In other words, the photosensitive resins 86 are not provided in portions where a resin paste which will become the first reflective layer 50 should be ejected. Specifically, in the screen mask 83, the photosensitive resins 86 are provided at positions corresponding to the openings 50X and 50Y of the first reflective layer 50. More specifically, in the screen mask 83, the photosensitive resins 86 are provided at positions corresponding to the external connection terminal pads 41P, positions corresponding to the light emitting element mounting regions CA, and positions corresponding to the openings 30X, and other portions are openings. In addition, the resin paste is transferred onto the insulating layer 20, the wiring patterns 30, and the metal layers 40 by activating a squeegee (squeegeeing) via the screen mask 83. Thereafter, a solvent of the resin paste is evaporated, thereby forming the first reflective layer 50 with a desired shape as shown in FIGS. 9A and 9B. In other words, the first reflective layer 50 is formed which has the opening 50X that exposes a portion of the metal layers 40 as the pads 40P and exposes a part of the insulating layer 20 formed in the opening 30X, and the opening 50Y that exposes a portion of the metal layers 41 as the external connection terminal pads 41P.

As such, by forming the first reflective layer 50, a portion of the metal layers 40 are exposed from the opening 50X as the pads 40P. For this reason, it is not necessary to perform electrolytic plating or the like on the wiring patterns 30 in order to improve contact characteristics after the first reflective layer 50 is formed. Thereby, it is possible to suppress deterioration in a plating solution which is used to form the metal layers 40. Specifically, in a case where plating (electrolytic plating or electroless plating) is performed on the wiring patterns 30 exposed from the opening 50X after forming the first reflective layer 50, a resin material or the like included in the first reflective layer 50 is eluted with respect to a plating solution used at that time. For this reason, there is a problem in that the plating solution deteriorates and thus the solution lifetime is shortened. In contrast, according to the manufacturing method of the present embodiment, when electrolytic plating is performed, the first reflective layer 50 is not formed, and thus it is possible to prevent the above-described problem in advance. That is, according to the manufacturing method of the present embodiment, it is possible to suppress a plating solution from deteriorating and to thereby suppress the solution lifetime of the plating solution from being shortened.

Figure 10A:
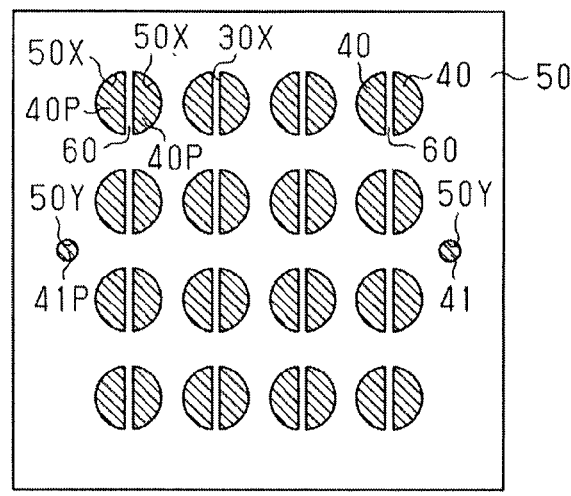
FIG. 10A is a schematic plan view illustrating the manufacturing step of the wiring substrate according to the embodiment.
Figure 10B:
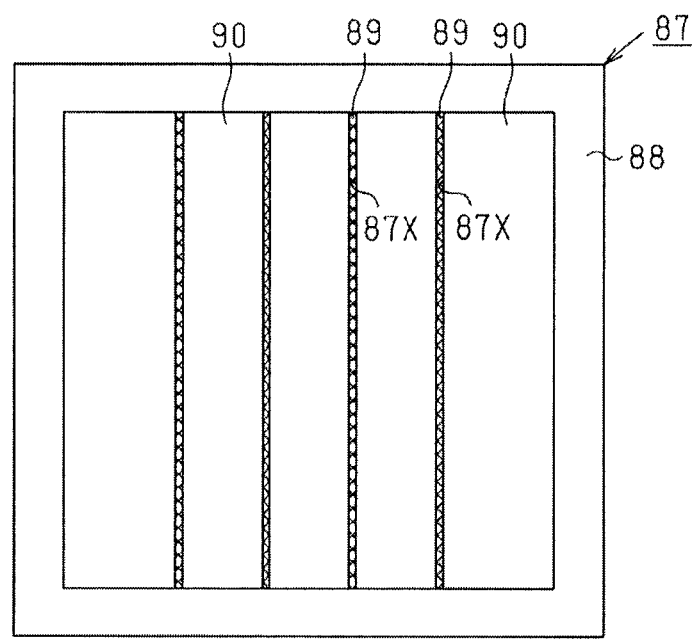
FIG. 10B is a schematic plan view illustrating the screen mask used for manufacturing the wiring substrate according to the embodiment.
Figure 11A:
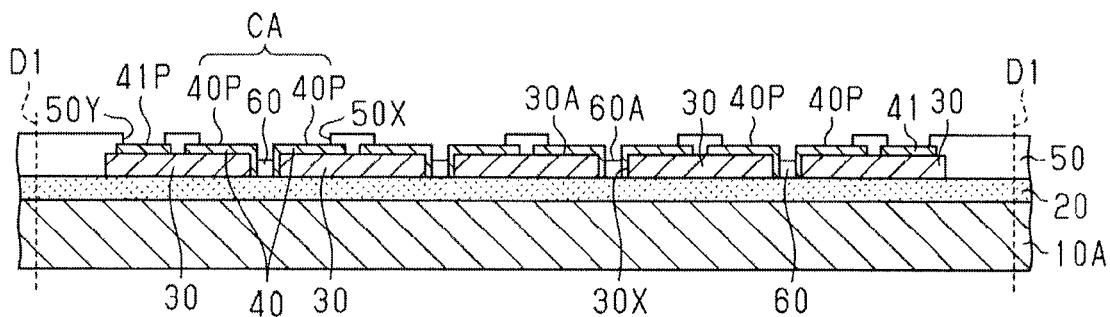

Next, in the step shown in FIG. 10A, the second reflective layer 60 is formed between the adjacent pads 40P. The second reflective layer 60 may be formed according to, for example, a screen printing method using a resin paste. Specifically, the screen printing method is performed using, for example, a screen mask 87 shown in FIG. 10B. In the screen mask 87, a metal mesh 89 is extended over a frame-shaped frame 88, and photosensitive resins 90 such as an emulsion are patterned in the metal mesh 89. In the screen mask 87, the photosensitive resins 90 are provided at positions other than portions corresponding to the openings 30X, and portions corresponding to the openings 30X are openings 87X of the screen mask 87. However, the width of the opening 87X is set to be smaller than the width of the opening 30X such that the resin is not leaked at the portions other than the opening 30X (between the pads 40P). Specifically, the width of the opening 87X may be appropriately set depending on a mask or positioning accuracy, and is set to be, for example, about 10 µm to 20 µm smaller than the width of the opening 30X. In addition, the resin paste is transferred onto the insulating layer 20 by activating a squeegee via the screen mask 87. Thereafter, a solvent of the resin paste is evaporated, thereby forming the second reflective layer 60 with a desired shape as shown in FIG. 11A. That is, the second reflective layer 60 is formed so as to cover the upper surface 20A of the insulating layer 20 which is formed between the wiring patterns 30 and between the pads 40P. At this time, the second reflective layer 60 is formed such that the upper surface 60A thereof is lower than the upper surface 30A of the wiring pattern 30. In addition, for example, by adjusting an amount of the resin paste transferred onto the insulating layer 20, it is possible to adjust the thickness of the second reflective layer 60.

Next, in the step shown in FIG. 11A, the first reflective layer 50 and the second reflective layer 60 are cured by performing a heat curing treatment in an atmosphere of a temperature of about 150° C.

Figure 11B:
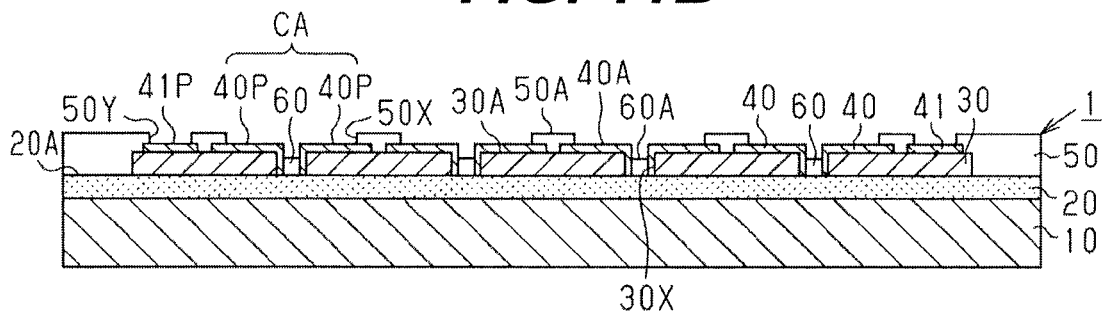

Thereafter, in the step shown in FIG. 11A, the structure shown in the same figure is cut along the cutting lines D1. Thereby, as shown in FIG. 11B, the wiring substrate 1 is formed as a unit piece, thereby manufacturing a plurality of wiring substrates 1.

Manufacturing Method of Light Emitting Device

Next, a manufacturing method of the light emitting device 2 will be described with reference to FIGS. 11C and 11D.

Figure 11C:
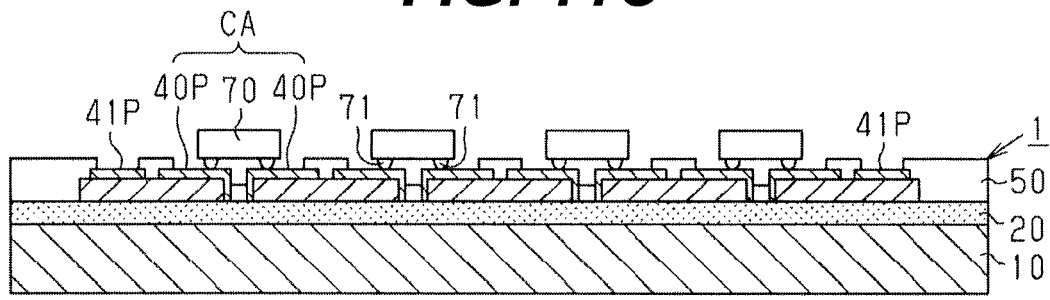

In the step shown in FIG. 11C, the light emitting element 70 is mounted on the pads 40P formed in each light emitting element mounting region CA of the wiring substrate 1. Specifically, the bumps 71 of the light emitting element 70 are flip-chip bonded to the respective surfaces of the adjacent pads 40P. For example, in a case where the bumps 71 are gold bumps, the bumps 71 are fixed onto the pads 40P through ultrasonic bonding.

Figure 11D:
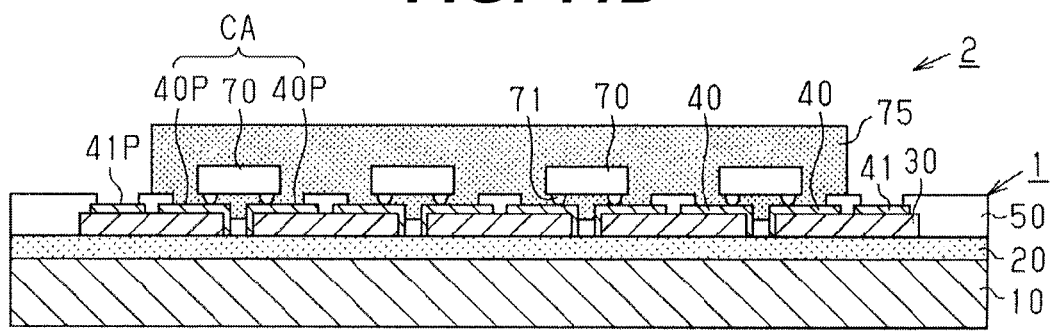

Next, in the step shown in FIG. 11D, the encapsulating resin 75 is formed to encapsulate a plurality of light emitting elements 70 and the bumps 71 mounted on the wiring substrate 1. For example, in a case where a thermosetting resin is used as the encapsulating resin 75, the structure shown in FIG. 11C is accommodated in a mold, and pressure (for example, 5 MPa to 10 Mpa) is applied to the inside of the mold, thereby introducing a fluidized resin thereinto. Thereafter, the resin is heated at, for example, about 180° C. so as to be cured, thereby forming the encapsulating resin 75. In addition, the encapsulating resin 75 may be formed by potting a liquid resin. Through the above-described manufacturing steps, the light emitting device 2 shown in FIG. 3 is manufactured.

Effects

According to the above-described present embodiment, the following effects can be achieved.

(1) The second reflective layer 60 formed between the pads 40P is formed so as to be lower than the first reflective layer 50 which is formed in regions other than the light emitting element mounting regions CA. Thereby, since the second reflective layer 60 which may interfere with the light emitting element 70 is formed thinly, interference (contact) between the second reflective layer 60 and the light emitting element 70 is appropriately suppressed. For this reason, even if the bumps 71 of the light emitting element 70 are made fine and thus a gap between the light emitting element 70 and the pads 40P is narrowed, it is possible to appropriately suppress interference between the second reflective layer 60 and the light emitting element 70. Therefore, since the light emitting element 70 can be mounted using the fine bumps 71, it is possible to miniaturize the entire light emitting device 2.

(2) In addition, since the reflective layer can be formed directly under the light emitting element 70 as well as in the peripheral region of the light emitting element mounting region CA, it is possible to increase reflectance of light from the light emitting element 70. Further, the first reflective layer 50 in which there is no concern of interference with the light emitting element 70 can be formed thickly (to be high) on the metal layers 40. For this reason, it is possible to increase reflectance of light from the light emitting element 70, for example, as compared with a case where the first reflective layer 50 is formed thinly (low) so as to be aligned with the second reflective layer 60. Therefore, it is possible to appropriately reduce light amount loss of the light emitting element 70.

(3) The second reflective layer 60 formed between the pads 40P is formed such that the upper surface 60A thereof is lower than the upper surface 40A of the metal layer 40. Thereby, even if a gap between the light emitting element 70 and the pads 40P is narrowed, it is possible to prevent interference between the second reflective layer 60 and the light emitting element 70.

(4) The second reflective layer 60 formed between the pads 40P is formed such that the upper surface 60A thereof is lower than the upper surface 30A of the wiring pattern 30. Thereby, since a gap between the light emitting element 70 and the second reflective layer 60 is secured widely, it is possible to efficiently reflect light from the light emitting element 70 upward or toward the first reflective layer 50. Therefore, it is possible to further increase reflectance of light from the light emitting element 70 and to thereby appropriately reduce light amount loss of the light emitting element 70.

(5) After the first reflective layer 50 is formed using the screen printing method, the second reflective layer 60 is formed using the screen printing method. As described above, the first reflective layer 50 and the second reflective layer 60 are formed in separate steps, and thus the first reflective layer 50 and the second reflective layer 60 can be easily set to have different thicknesses. Specifically, since an amount of the resin paste required for forming the first reflective layer 50 and an amount of the resin paste required for forming the second reflective layer 60 can be adjusted separately, the first reflective layer 50 and the second reflective layer 60 can respectively be easily adjusted to desired thicknesses.

(6) After the metal layers 40 are formed on the wiring patterns 30 using the electrolytic plating method, the first reflective layer 50 is formed so as to cover a portion of the wiring patterns 30 and the metal layers 40. In this case, since the first reflective layer 50 is not formed when the metal layers 40 are formed using the electrolytic plating method, it is possible to prevent deterioration in advance in a plating solution due to the presence of the first reflective layer 50. Thereby, it is possible to increase the solution lifetime of the plating solution and to thereby continuously use the plating solution. As a result, it is possible to contribute to cost reduction.

(7) The metal layers 40 are formed using the electrolytic plating method. Thereby, it is possible to reduce manufacturing costs as compared with a case of forming the metal layers 40 using an electroless plating method.

Other Embodiments

In addition, the above-described embodiment may be performed in the following aspects by appropriately modifying the embodiment.

In the above-described embodiment, the second reflective layer 60 is formed after the first reflective layer 50 is formed. The present invention is not limited thereto, and, the first reflective layer 50 may be formed after the second reflective layer 60 is formed.

Figure 12A:
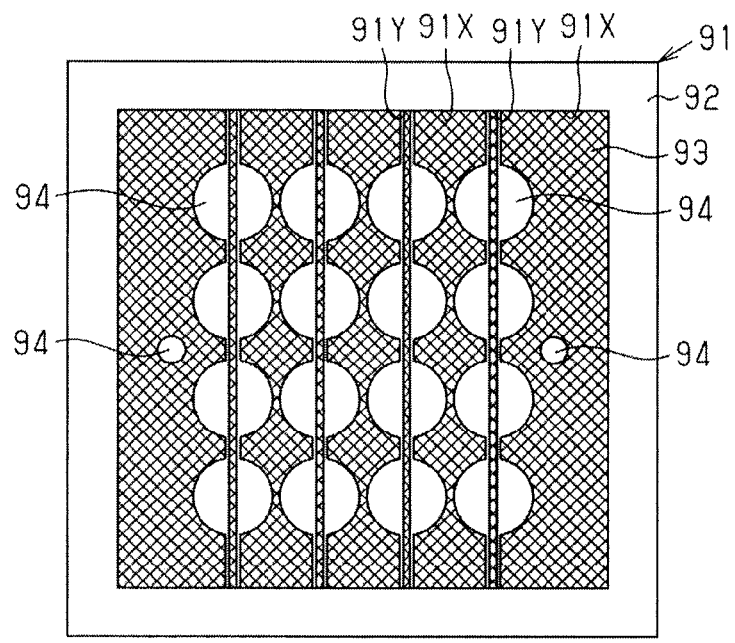
FIG. 12A is a schematic plan view illustrating a screen mask used for manufacturing a wiring substrate according to a modified example of the embodiment.
Figure 12B:
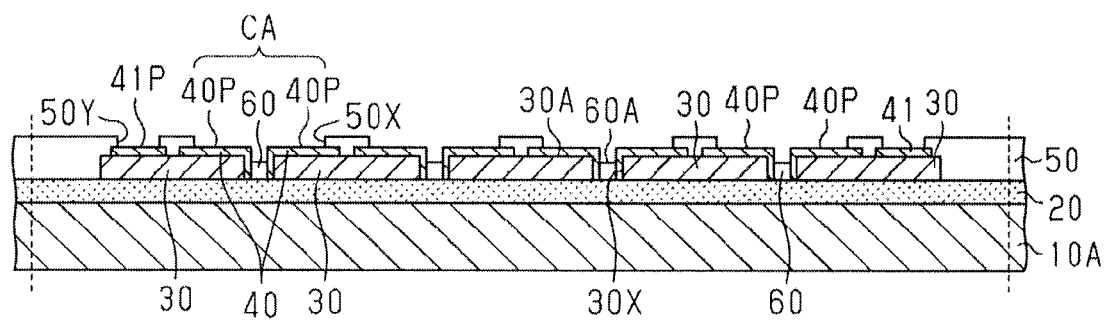

In the above-described embodiment, the first reflective layer 50 and the second reflective layer 60 are formed in the separate steps. In other words, the first reflective layer 50 is formed through the screen printing method using the screen mask 83, and the second reflective layer 60 is formed through the screen printing method using the screen mask 87. The present invention is not limited thereto, and the first reflective layer 50 and the second reflective layer 60 may be formed together. For example, the first reflective layer 50 and the second reflective layer 60 may be formed together through a screen printing method using a screen mask 91 shown in FIG. 12A. In the screen mask 91, a metal mesh 93 is extended over a frame-shaped frame 92, and photosensitive resins 94 such as an emulsion are patterned in the metal mesh 93. In the screen mask 91, the photosensitive resins 94 are provided at positions other than portions corresponding to the regions where the first and second reflective layers 50 and 60 are formed. In addition, in the screen mask 91, portions corresponding to the regions where the first reflective layer 50 is formed are the openings 91X of the screen mask 91, and portions corresponding to the regions where the second reflective layer 60 is formed are the openings 91Y of the screen mask 91. However, the width of the opening 91Y is set to be smaller than the width of the opening 30X such that the resin is not leaked at positions other than the opening 30X (between the pads 40P) and the second reflective layer 60 is formed so as to be thinner than the first reflective layer 50. Specifically, the width of the opening 91Y may be appropriately set depending on a mask or positioning accuracy, and is set to be, for example, about 10 μm to 20 μm smaller than the width of the opening 30X. In addition, the resin paste is transferred onto the insulating layer 20, the wiring patterns 30, and the metal layers 40 and 41 by moving a squeegee via the screen mask 91. Thereafter, a solvent of the resin paste is evaporated, thereby forming the first and second reflective layers 50 and 60 with a desired shape as shown in FIG. 12B. Specifically, the first reflective layer 50 is formed which has the opening 50X that exposes a portion of the metal layers 40 as the pads 40P, and the opening 50Y that exposes a portion of the metal layers 41 as the external connection terminal pads 41P. In addition, the second reflective layer 60 is formed so as to cover the upper surface 20A of the insulating layer 20 which is formed between the wiring patterns 30 and between the pads 40P. At this time, the second reflective layer 60 is formed such that the upper surface 60A thereof is lower than the upper surface 30A of the wiring pattern 30. In addition, by decreasing an amount of the resin paste ejected between the wiring patterns 30 and between the pads 40P of the screen mask 91, for example, by making the opening 91Y of the screen mask 91 small as described above, it is possible to form the second reflective layer 60 so as to be thinner than the first reflective layer 50.

In the above-described embodiment, the first and second reflective layers 50 and 60 are formed using the screen printing method. The present invention is not limited thereto, and, for example, in a case where a photosensitive insulating resin is used as a material of the first reflective layer 50, a resist layer which will become the first reflective layer 50 is formed so as to cover the insulating layer 20, the wiring patterns 30, and the metal layers 40, then the resist layer is exposed and developed through a photolithography method so as to form the openings 50X and 50Y, thereby forming the first reflective layer 50. This is also the same for the second reflective layer 60.

The first and second reflective layers 50 and 60 may be formed using a manufacturing method shown in FIG. 13. Specifically, the wiring patterns 30 are formed on the upper surface 20A of the insulating layer 20 formed on the substrate 10A through the same manufacturing steps as the previous manufacturing steps shown in FIGS. 4 to 8C, and the metal layers 40 and 41 are formed so as to cover a portion of the surfaces (the upper surfaces 30A and the side surfaces) of the wiring patterns 30.

Figure 13A:
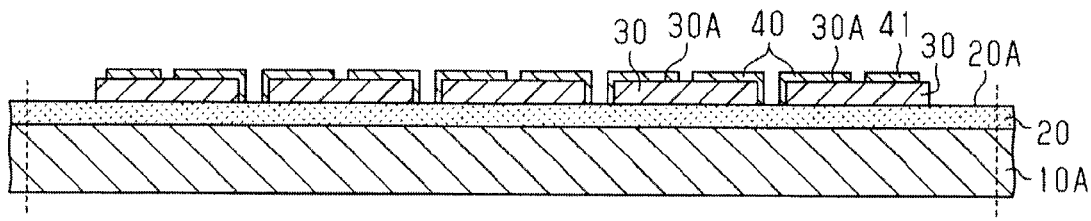
Figure 13B:
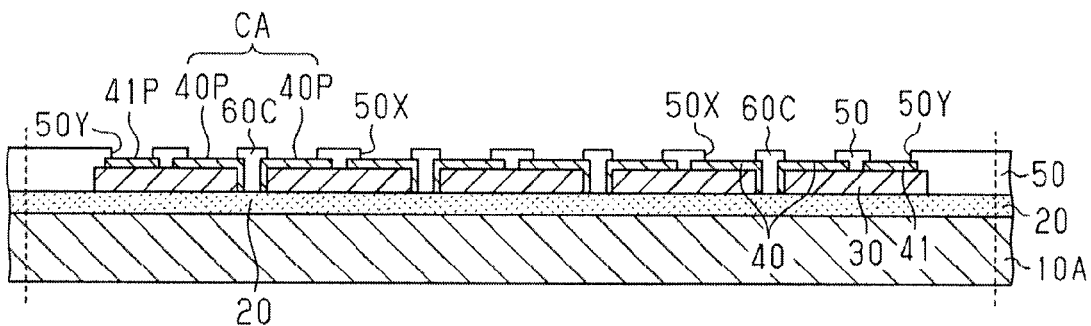

Next, in the step shown in FIG. 13B, the first reflective layer 50 having the openings 50X and 50Y and a second reflective layer 60C which covers the insulating layer 20 exposed in the light emitting element mounting region CA are formed on the insulating layer 20, the wiring patterns 30, and the metal layers 40. The first reflective layer 50 and the second reflective layer 60C are formed so as to have the approximately same height. In addition, the second reflective layer 60C may be formed so as to cover a portion of the pads 40P as shown in the figure. The first reflective layer 50 and the second reflective layer 60C may be formed according to, for example, a screen printing method using a resin paste. In addition, the first reflective layer 50 and the second reflective layer 60C are cured by performing a heat curing treatment in an atmosphere of a temperature of about 150° C.

Figure 13C:
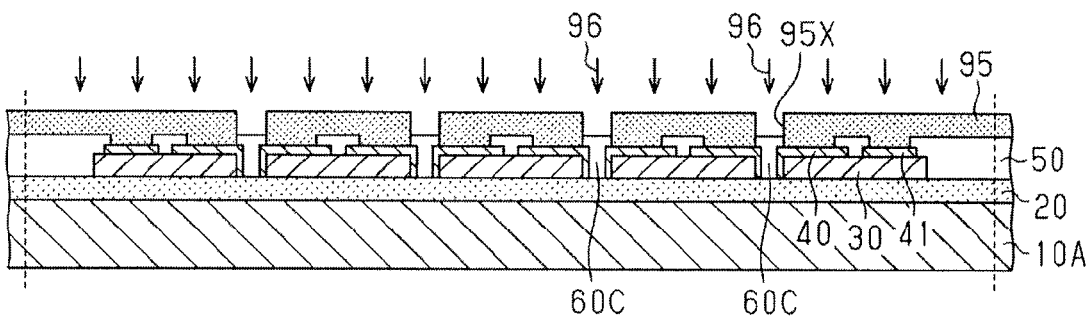

Next, in the step shown in FIG. 13C, a mask 95 for protection from blast, having openings 95X of a predetermined pattern, is formed on the metal layers 40 and the first reflective layer 50. The openings 95X are formed so as to expose the second reflective layer 60C only. As a material of the mask 95, a material having characteristics of blast-process resistance may be used. In addition, as a material of the mask 95, a photosensitive dry film resist, a liquid photoresist (for example, a dry film resist or a liquid resist of a Novolac resin, an acryl resin, or the like), or the like may be used. For example, in a case of using the photosensitive dry film resist, a dry film is formed on the metal layers 40, the first reflective layer 50, and the second reflective layer 60C through thermocompression, and the dry film is patterned through exposure and development, thereby forming the mask 95. Further, in a case where the liquid photoresist is used as well, the mask 95 may be formed through the same steps.

Figure 13D:
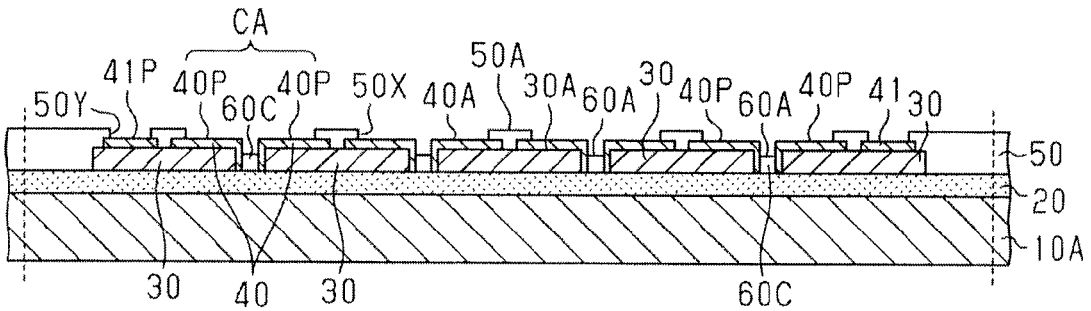

Next, a blast process is performed on the second reflective layer 60C via the openings 95X of the mask 95. In other words, polishing particles 96 are blasted at the openings 95X of the mask 95, thereby thinning the second reflective layer 60C to a predetermined thickness (the thickness of the second reflective layer 60C exposed from the opening 95X is made to be reduced as a whole). Specifically, as shown in FIG. 13D, the second reflective layer 60C is cut down via the openings 95X of the mask 95 such that the upper surface 60A of the second reflective layer 60C formed by the thinning is lower than the upper surface 30A of the wiring pattern 30. In addition, when the thinning of the second reflective layer 60C progresses, and then a portion of the metal layers 40 are exposed, the polishing particles 96 are blasted at the metal layers 40. However, the metal layers 40 are made of a material (metal) having relatively low brittleness, and thus has a slower processing rate than the second reflective layer 60C made of a material (a cured resin or the like) having the relatively high brittleness. For this reason, the metal layers 40 are more difficult to remove than the second reflective layer 60C and thus a variation in the shape thereof due to the blast process is slight.

In addition, through the blast process, the second reflective layers 60C are formed between the wiring patterns 30 and between the pads 40P so as to be thinner than the first reflective layer 50 and to be thinner than the wiring pattern 30.

Here, the first reflective layer 50 and the second reflective layer 60C are mainly made of a thermosetting insulating resin from the characteristics thereof and are thus formed using the screen printing method in many cases as described above. However, in the screen printing method, positioning accuracy is lower than that of a photolithography method, and blurring tends to occur. For this reason, if the second reflective layers 60C are formed between the wiring patterns 30 and between the pads 40P, the second reflective layers 60C are formed so as to cover a portion of the pads 40P due to misalignment or blurring in some cases as shown in FIG. 13B. In these cases, since the second reflective layer 60C formed just under the light emitting element 70 is formed so as to be higher than the pad 40P, the light emitting element 70 and the second reflective layer 60C tend to interfere with each other. In contrast, in the above-described manufacturing method, since the second reflective layers 60C which are formed so as to cover a portion of the pads 40P can be removed through the blast process, it is possible to appropriately suppress interference between the light emitting element 70 and the second reflective layer 60C.

In addition, as the blast process, for example, a wet blast process or a dry blast process may be used. Here, the wet blast process is preferably used since high processing accuracy is obtained, work efficiency is favorable, or the like.

Alternatively, the thinning process may be performed using, for example, resin etching or laser processing.

Figure 14A:
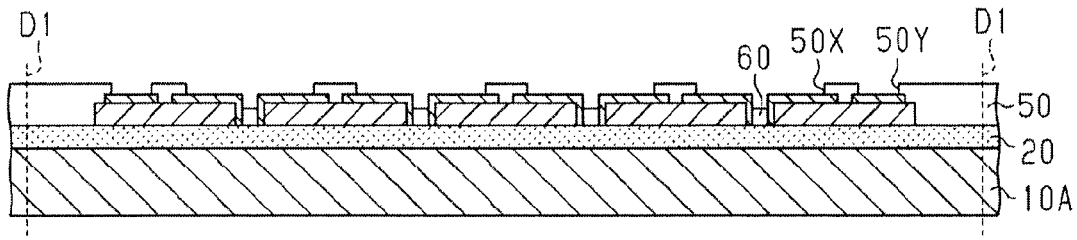
Figure 14B:
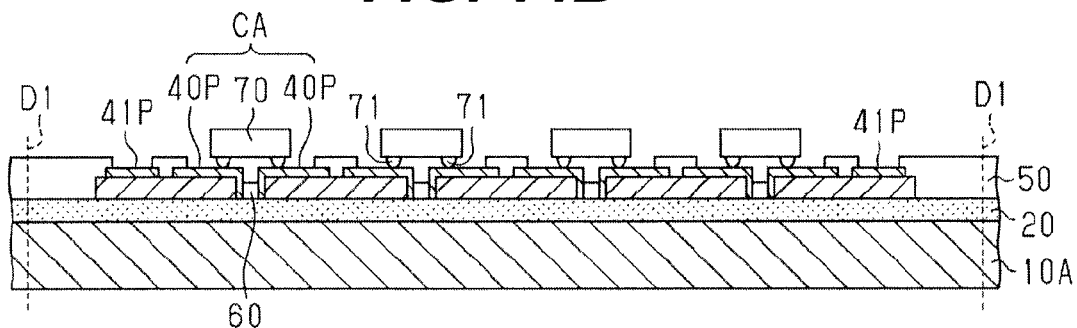
Figure 14C:
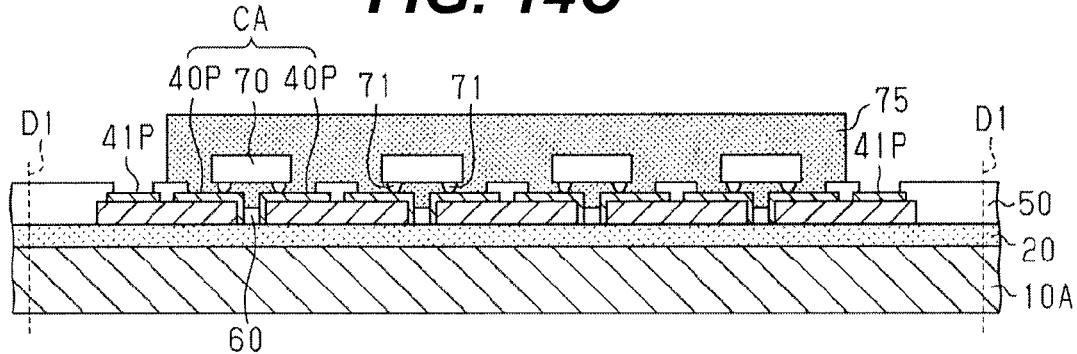
Figure 14D:
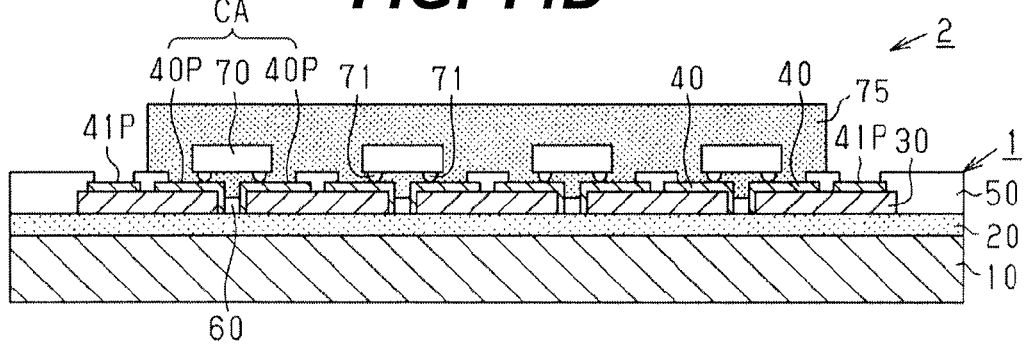

In the above-described embodiment, the wiring substrate 1 is generated as a unit piece, and then the light emitting element 70 is mounted on the pads 40P of the wiring substrate 1. The present invention is not limited thereto, and, as shown in FIG. 14, the light emitting element 70 may be mounted on the pads 40P before the wiring substrate 1 is formed as a unit piece, and then cutting may be performed along the cutting lines D1, thereby obtaining each light emitting device 2. Specifically, as shown in FIG. 14A, after forming the first and second reflective layers 50 and 60, the light emitting element 70 is mounted on the pads 40P as shown in FIG. 14B without cutting along the cutting lines D1. Next, as shown in FIG. 14C, after the light emitting elements 70 are encapsulated with the encapsulating resin 75, cutting may be performed along the cutting lines D1, thereby obtaining each light emitting device 2 as shown in FIG. 14D. In addition, the encapsulating resin 75 may be formed for the respective partitions where the wiring substrate forming regions C1 are formed in a matrix (in FIG. 4, 3×3) using a collective molding method, or may be formed for each wiring substrate forming region C1 using a separate molding method.

Figure 15A:
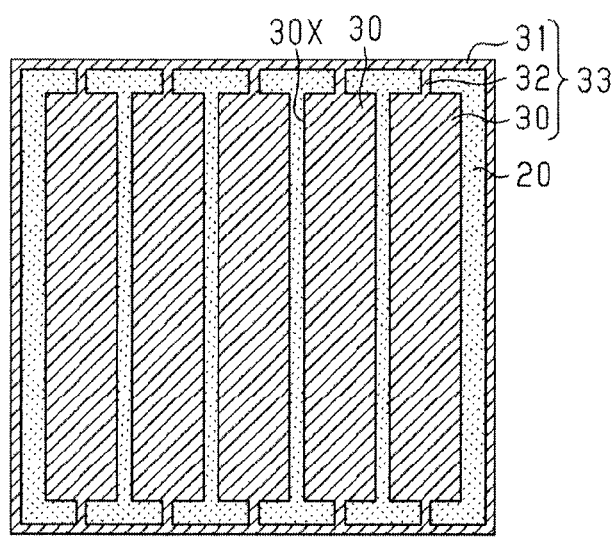
FIGS. 15A to 15C are schematic plan views illustrating manufacturing steps of a wiring substrate according to a modified example of the embodiment.
Figure 15B:
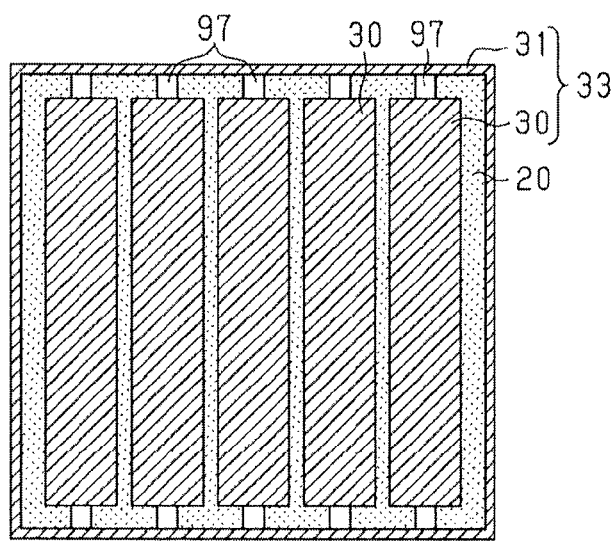

In the above-described embodiment, after the metal layers 40 are formed so as to cover a portion of the wiring patterns 30, the wiring patterns 30 and the metal layers 40 are entirely masked, and the feed line 31 and the connection portions 32 are removed through etching. The present invention is not limited thereto, and, for example, modified manufacturing steps shown in FIGS. 15 and 16 may be employed. Specifically, as shown in FIG. 15A, the wiring patterns 30, the feed line 31, and the connection portions 32 are formed on the insulating layer 20 in the same manner as the previous step shown in FIG. 5. Next, in the step shown in FIG. 15B, a resist layer 97 is formed so as to cover the connection portions 32 of the wiring layers 33 only on the connection portions 32. As a material of the resist layer 97, a material having plating resistance may be used. Specifically, as a material of the resist layer 97, a photosensitive dry film resist, a liquid photoresist (for example, a dry film resist or a liquid resist of a Novolac resin, an acryl resin, or the like), or the like may be used.

Next, electrolytic plating where the wiring layers 33 are used as plating feed layers is performed on the surfaces (the upper surfaces and the side surfaces) of the wiring patterns 30 and the feed line 31 by using the resist layer 97 as a plating mask. Thereby, as shown in FIG. 15C, metal layers 42 are formed so as to cover the entire surfaces of the wiring patterns 30, and a metal layer 43 is formed so as to cover the entire surface of the feed line 31.

Figure 15C:
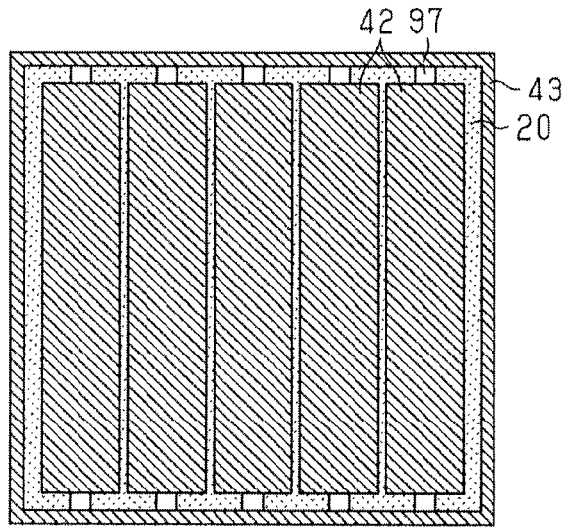
Figure 16A:
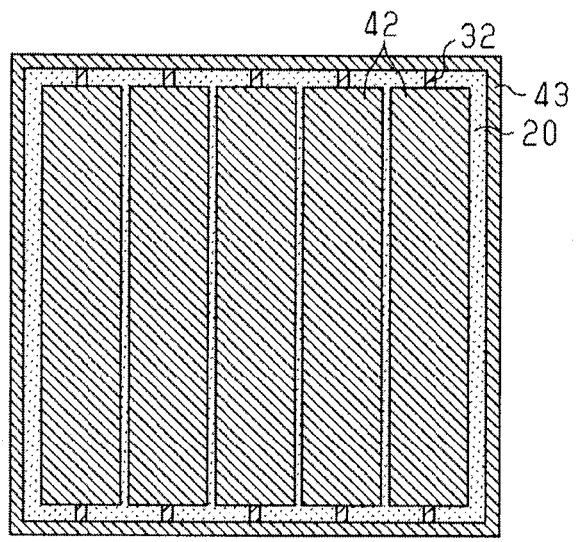
FIGS. 16A and 16B are schematic plan views illustrating manufacturing steps of a wiring substrate according to a modified example of the embodiment.
Figure 16B:
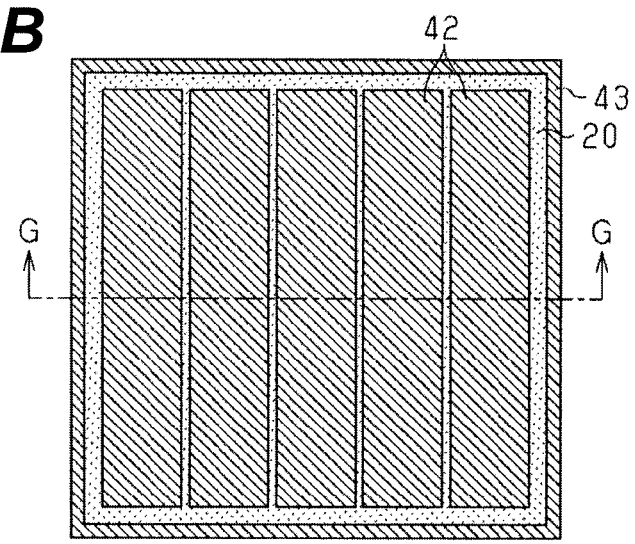
Figure 16C:
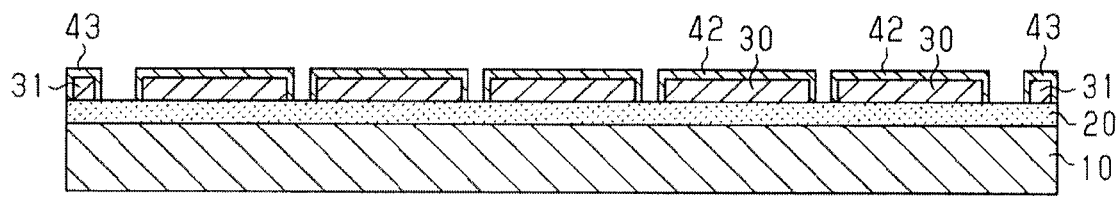
FIG. 16C is a schematic cross-sectional view illustrating the manufacturing step of the wiring substrate taken along the line G-G position of FIG. 16B.

Next, in the step shown in FIG. 16A, the resist layer 97 shown in FIG. 15C is removed by, for example, an alkaline stripping agent. Thereafter, in the step shown in FIG. 16B, the connection portions 32 are selectively removed with respect to the metal layers 42 and 43. For example, in a case where the metal layers 42 and 43 are Ni/Au layers, the connection portions 32 made of copper can be selectively removed with respect to the metal layers 42 and 43 through wet etching using a ferric chloride solution, a cupric chloride solution, an ammonium persulfate solution, or the like. Thereby, as shown in FIG. 16C, the wiring patterns 30, the surfaces (the upper surfaces and the side surfaces) of which are covered by the metal layers 42, and the feed line 31, the surface of which is covered by the metal layer 43, are not removed and are left.

With this structure, since the feed line 31 and the metal layer 43 with the relatively high rigidity are formed in the outer circumferential region of the wiring substrate 1, it is possible to increase the rigidity of the wiring substrate 1. Therefore, it is possible to appropriately suppress the wiring substrate 1 from being bent or deformed due to thermal contraction. In other words, with this structure, the feed line 31 and the metal layer 43 can be used as a reinforcement layer. In addition, even if the feed line 31 and the metal layer 43 covering the feed line 31 are remained in the wiring substrate 1 formed as a unit piece, the feed line 31 is separated from a plurality of wiring patterns 30, and thus there is no problem in terms of the characteristics of the wiring substrate 1.

Alternatively, in the previous step shown in FIG. 15B, the resist layer 97 may be formed so as to cover the feed line 31 and the connection portions 32 of the wiring layers 33. Thereby, even if the metal layers 42 are formed on the entire surfaces of the wiring patterns 30 of the wiring layers 33 only, the feed line 31 and the connection portions 32 are selectively removed through the step shown in FIG. 16B.

Although, in the above-described embodiment, the metal layers 40 are formed using the electrolytic plating method, the present invention is not limited thereto, and, for example, the metal layers 40 may be formed using an electroless plating method. In this case, when the copper foil 30B is patterned, the formation of the feed line 31 and the connection portions 32 may be omitted. For this reason, the steps (the steps shown in FIGS. 7 and 8) of removing the feed line 31 and the connection portions 32 can be also omitted.

In the light emitting element 70 of the above-described embodiment, one bump 71 is flip-chip bonded to one pad 40P of the two pads 40P formed in each light emitting element mounting region CA, and the other bump 71 is flip-chip bonded to the other pad 40P. The present invention is not limited thereto, and, for example, a plurality of bumps 71 may be flip-chip bonded to one pad 40P, and a plurality of bumps 71 may be flip-chip bonded to the other pad 40P.

However, in a case where a single bump 71 is bonded to a single pad 40P, there is only one connection location on each pad 40P, and thus there is a concern that the light emitting element 70 mounted on the wiring substrate 1 may be tilted. In contrast, in the structure according to the modified example, a plurality of bumps 71 are bonded to a single pad 40P, and thus there are a plurality of connection locations on each pad 40P. Thereby, it is possible to stably mount the light emitting element 70 on the wiring substrate 1.

In the above-described embodiment, the light emitting element 70 is flip-chip mounted on the pads 40P formed on the upper surface of the wiring substrate 1. The present invention is not limited thereto, and, for example, the light emitting element may be mounted on the pads 40P in a wire bonding manner. In this case, for example, the light emitting element is bonded onto one pad 40P formed in each light emitting element mounting region CA via an adhesive, one electrode of the light emitting element is electrically connected to one pad 40P via a bonding wire, and the other electrode thereof is electrically connected to the other pad 40P via a bonding wire. In this structure as well, it is possible to suppress interference (contact) between the second reflective layer 60 and the bonding wire by forming the second reflective layer 60 formed in the light emitting element mounting region CA so as to be thinner than the wiring pattern 30.

As shown in FIG. 17A, the first reflective layer 50 in the above-described embodiment may be formed such that the upper surface 50A thereof is higher than the surface (here, the formation surface 70A of the bumps 71) of the light emitting element 70 facing the pads 40P when the light emitting element 70 is flip-chip mounted on the pads 40P. As such, the first reflective layer 50 formed in regions other than the light emitting element mounting regions CA is formed to be higher than the formation surface 70A, and thereby it is possible to efficiently reflect light from the light emitting element 70 upward.

As shown in FIG. 17B, the side walls of the first reflective layer 50 in the above-described embodiment, specifically, the side walls 50B of the opening 50X of the first reflective layer 50 may be formed so as to be tilted. More specifically, a shape of the opening 50X may be a tapered shape of which the diameter increases toward the top from the bottom.

As shown in FIG. 18, a recessed portion 10X may be formed in the light emitting element mounting region CA of the wiring substrate 1, and the light emitting element 70 may be mounted in the recessed portion 10X. In this case, the insulating layer 20 and the wiring patterns 30 are formed in the recessed portion 10X, the metal layers 40 are formed on the surfaces of the wiring patterns 30, and the second reflective layer 60 which is thinner than the wiring pattern 30 is formed between the metal layers 40. In addition, the light emitting element 70 is mounted on the metal layers 40 (pads 40P) formed on the bottom of the recessed portion 10X. Further, in FIG. 17, the light emitting element 70 is flip-chip mounted; however, the light emitting element 70 may be mounted in a wire bonding manner, instead of the flip-chip bonding.

In a case where the heat sink 10 in the above-described embodiment is made of an insulating material such as, for example, a ceramic material, the insulating layer 20 may be omitted. In this case, the wiring patterns 30 may be directly formed on the heat sink 10.

In the above-described embodiment, a plurality of light emitting elements 70 mounted on the wiring substrate 1 are collectively encapsulated with the encapsulating resin 75. The present invention is not limited thereto, and the light emitting element 70 mounted in each light emitting element mounting region CA may be encapsulated separately with an encapsulating resin.

In the above-described embodiment, after the metal layers 40 and 41 are formed, the first and second reflective layers 50 and 60 are formed. The present invention is not limited thereto, and, for example, after the first reflective layer 50 having the openings 50X and 50Y and the second reflective layer 60 are formed, the metal layers 40 and 41 may be respectively formed on the wiring patterns 30 exposed from the openings 50X and 50Y. Specifically, after the first and second reflective layers 50 and 60 are formed, the electrolytic plating may be performed on the wiring patterns 30 exposed from the openings 50X and 50Y, thereby forming the metal layers 40 and 41.

A planar shape of the opening 50X or the metal layer 40 in the above-described embodiment is not particularly limited.

A planar shape of the opening 50Y or the metal layer 41 in the above-described embodiment is not limited to a circular shape, and may be, for example, a polygonal shape such as a rectangular shape or a pentagonal shape, a semi-circular shape, an elliptical shape, or a semi-elliptical shape.

The above-described embodiment is implemented using the multi-piece manufacturing method, but may be implemented using a single-piece manufacturing method. In other words, a base material with the size corresponding to a single wiring substrate 1 may be used instead of the multi-piece substrate 10A, and the wiring substrate 1 and the light emitting device 2 may be manufactured.

A planar shape of each of the wiring substrate 1 and the light emitting device 2 in the above-described embodiment is not limited to a rectangular shape, and may be, for example, a polygonal shape such as a triangular shape or a pentagonal shape, or a circular shape.

The number or arrangement of the light emitting elements 70 mounted on the wiring substrate 1 in the above-described embodiment is not particularly limited.

Figure 19A:
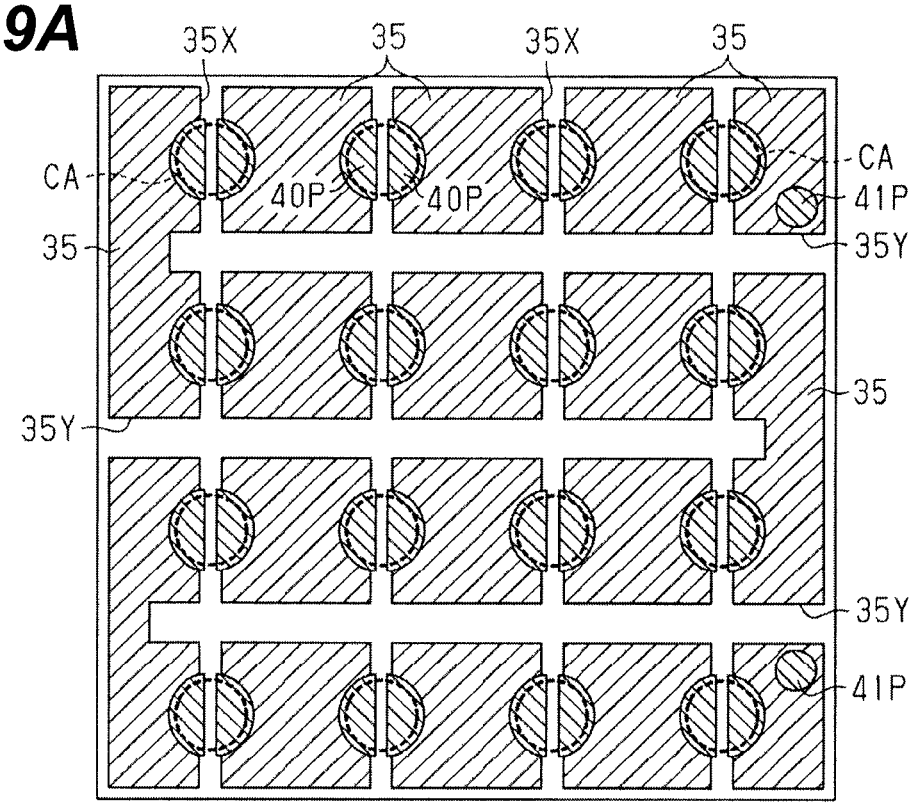
FIGS. 19A and 19B are schematic plan views illustrating a wiring pattern and a metal layer according to a modified example of the embodiment.

A shape of the wiring pattern 30 in the above-described embodiment is not particularly limited. For example, a wiring pattern may be formed as shown in FIG. 19A. In other words, a plurality of wiring patterns 35 with an approximately rectangular shape in plan view may be disposed in an approximately W shape in plan view. In this case, a groove-shape opening 35X extending in the vertical direction of the figure is formed between the wiring patterns 35 which are adjacent to each other in the horizontal direction of the figure. In addition, a strip-shaped opening 35Y extending in the horizontal direction of the figure is formed between the wiring patterns 35 which are adjacent to each other in the vertical direction of the figure. A plurality of wiring patterns 35 are separated from each other by the openings 35X and 35Y. Metal layers functioning as the pads 40P are formed on the wiring patterns 35. The wiring patterns 35 have light emitting element mounting regions CA (refer to the broken line circles) arranged in a matrix (in this embodiment, matrix of 4×4). In addition, a pair of metal layers functioning as the external connection terminal pads 41P are formed on the wiring patterns 35. The pair of external connection terminal pads 41P are respectively formed on the wiring patterns 35 which are positioned at the start point and end point of the W shape among a plurality of wiring patterns 35 arranged in an approximately W shape. In a case where light emitting elements are mounted on a wiring substrate provided with the wiring patterns 35 and the external connection terminal pads 41P, a plurality of (here, sixteen) light emitting elements are connected in series between one external connection terminal pad 41P and the other external connection terminal pad 41P.

Figure 19B:
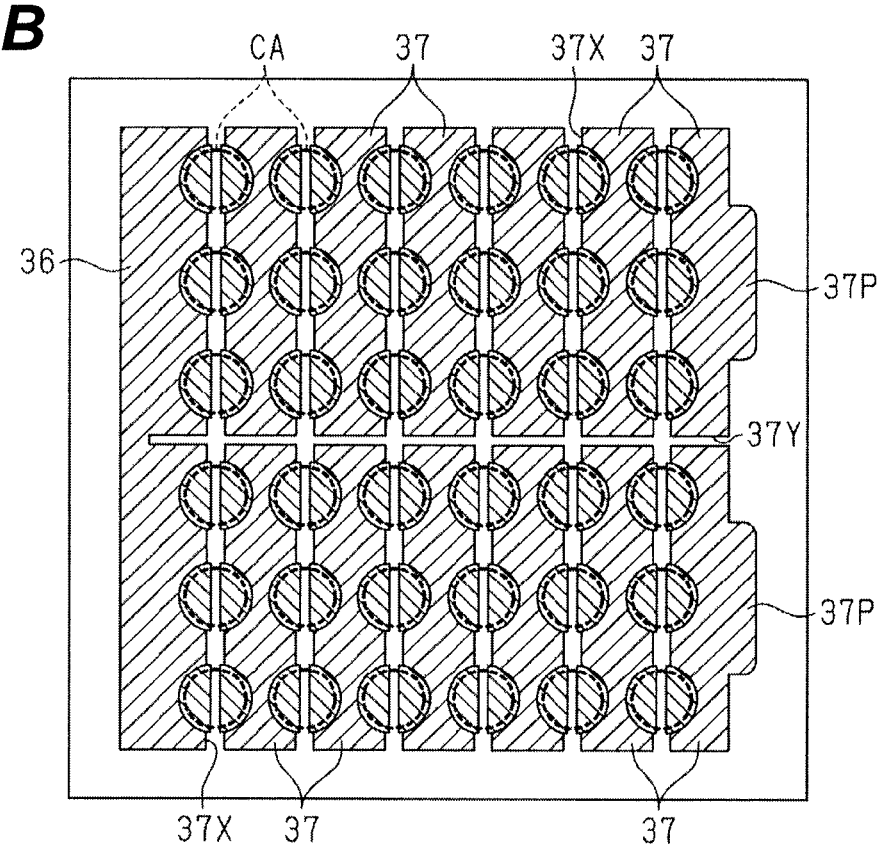

Alternatively, a wiring pattern may be formed as shown in FIG. 19B. In other words, a wiring pattern 36 with an approximately strip shape in plan view may be disposed, and a plurality of wiring patterns 37 with an approximately rectangular shape in plan view, disposed in parallel to the wiring pattern 36 so as to be adjacent to each other, may be disposed in a matrix (in this embodiment, matrix of 6×2). That is, the wiring pattern 36 is commonly provided with respect to the adjacent wiring patterns 37 of two rows. In this case, groove-shaped openings 37X extending in the vertical direction of the figure are formed between the wiring patterns 36 and 37 and between the respective wiring patterns 37 which are adjacent to each other in the horizontal direction of the figure. In addition, strip-shaped openings 37Y extending in the horizontal direction of the figure are formed between the wiring patterns 37 which are adjacent to each other in the vertical direction of the figure. The wiring patterns 36 and 37, and the wiring patterns 37 are respectively separated from each other by the openings 37X and 37Y. Metal layers functioning as the pads 40P are formed on the wiring patterns 36 and 37. The wiring patterns 36 and 37 have light emitting element mounting regions CA (refer to the broken line circles) arranged in a matrix (in this embodiment, matrix of 6×6). In addition, the wiring patterns 37 have a pair of external connection terminal pads 37P. The pair of external connection terminal pads 37P are formed in two wiring patterns 37 which are the farthest from the wiring pattern 36. In a case where light emitting elements are mounted on a wiring substrate provided with the wiring patterns 36 and 37 and the external connection terminal pads 37P, the light emitting elements arranged in a matrix (in this embodiment, matrix of 6×3) are connected in series and in parallel between the wiring pattern 36 and one external connection terminal pad 37P. In addition, the light emitting elements arranged in a matrix are connected in series and in parallel between the wiring pattern 36 and the other external connection terminal pad 37P. Further, the light emitting element groups connected in series and in parallel are connected in series.

Figure 20:
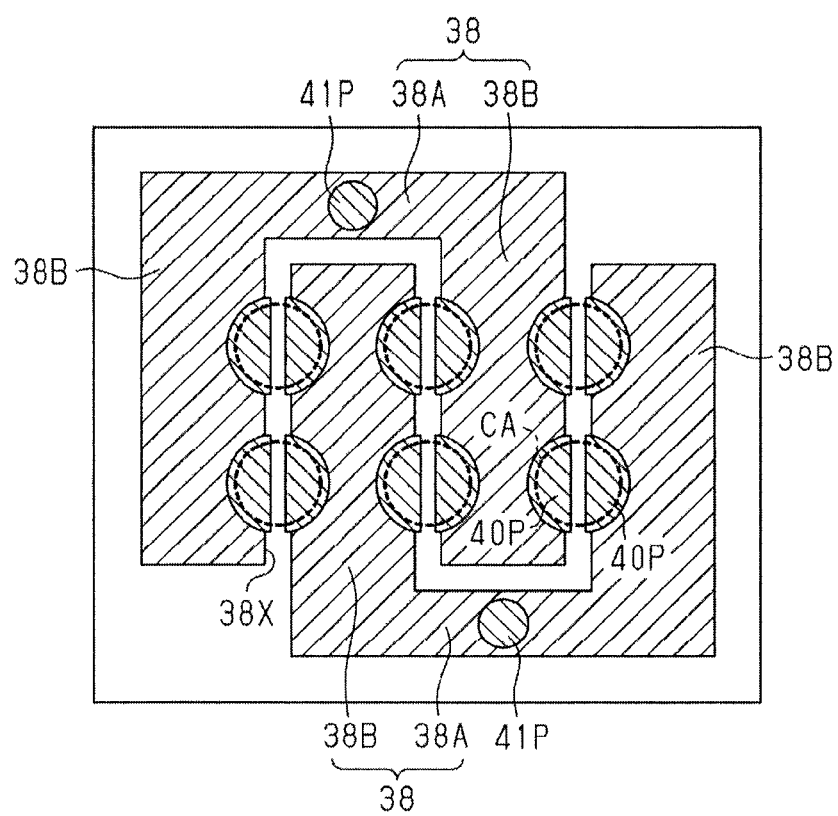
FIG. 20 is a schematic plan view illustrating a wiring pattern and a metal layer according to a modified example of the embodiment.

Alternatively, a wiring pattern might be formed as shown in FIG. 20. In other words, a pair of wiring patterns 38 with an approximately comb shape in plan view may be formed. Specifically, the wiring pattern 38 has an electrode portion 38A which is formed in a rectangular shape in plan view and has an upper surface on which a metal layer functioning as the external connection terminal pad 41P is formed, and a plurality of (in FIG. 20, two) extending portions 38B with a comb-teeth shape extending inward from the electrode portion 38A. The pair of wiring patterns 38 are disposed such that the mutual extending portions 38B are alternately arranged. In this case, an opening 38X with an approximately Z shape in plan view is formed between the wiring patterns 38. The pair of wiring patterns 38 are separated from each other by the opening 38X. Metal layers functioning as the pads 40P are formed on the extending portions 38B. The wiring patterns 38 have light emitting element mounting regions CA arranged in a matrix (here, 3×2). The light emitting element mounting region CA includes the pads 40P formed on a pair of wiring patterns 38 separated by the opening 38X. In a case where light emitting elements are mounted on a wiring substrate provided with the wiring patterns 38 and the external connection terminal pads 41P, a plurality of light emitting elements are connected in series and in parallel between one external connection terminal pad 41P and the other external connection terminal pad 41P.

Application Example of Light Emitting Device

Figure 21:
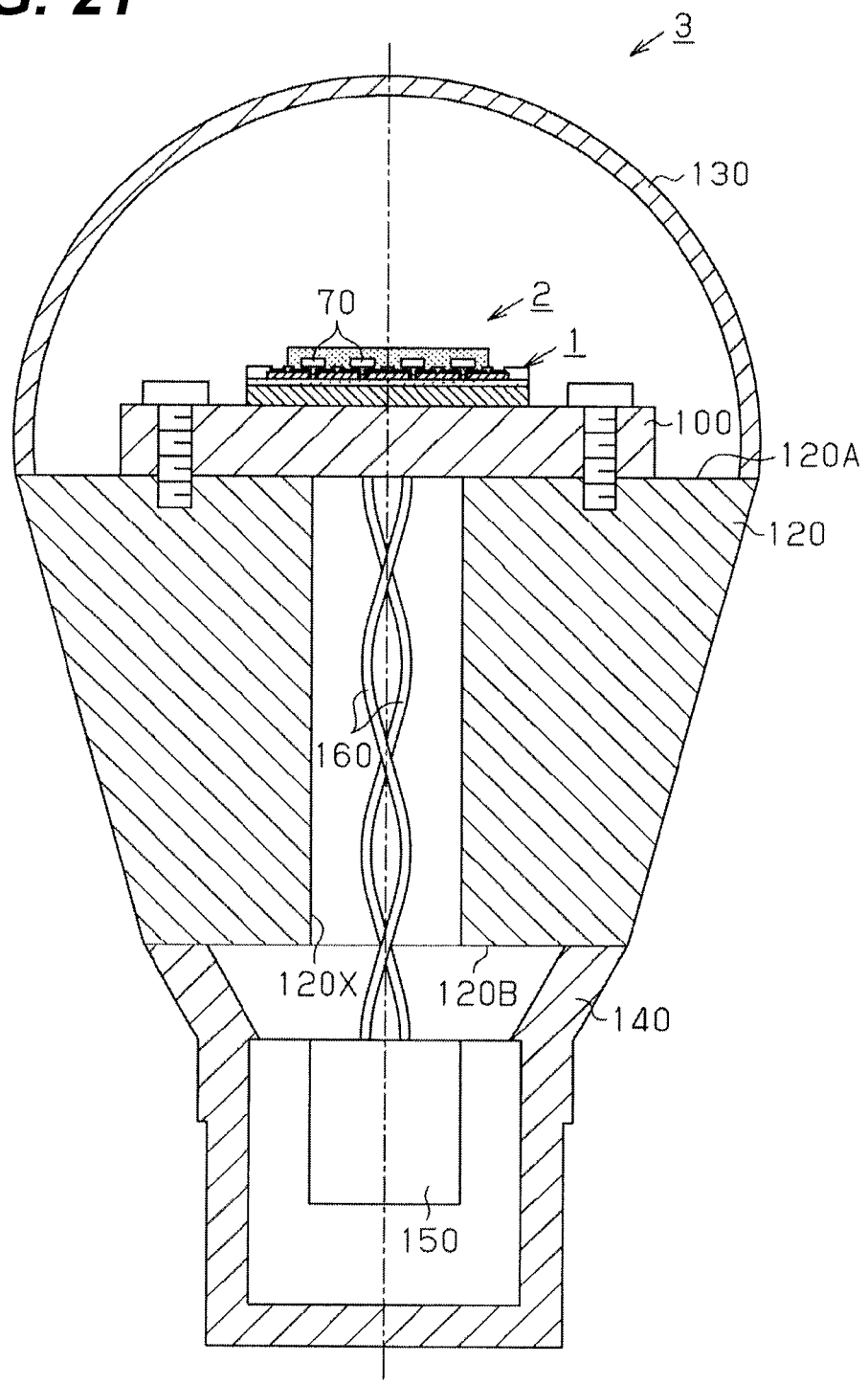
FIG. 21 is a schematic cross-sectional view illustrating an application example of the light emitting device.

FIG. 21 shows a cross-sectional view illustrating a state that the light emitting device 2 according to the embodiment is applied to an illumination apparatus 3.

The illumination apparatus 3 includes the light emitting device 2, a mounting board 100 having the light emitting device 2 mounted thereon, and an apparatus main body 120 in which the mounting board 100 is installed. In addition, the illumination apparatus 3 includes a cover 130 which is installed in the apparatus main body 120 and covers the light emitting device 2, a holder 140 which holds the apparatus main body 120, and a lighting circuit 150 which is fitted to the holder 140 and turns on the light emitting elements 70.

The apparatus main body 120 is formed in an approximately truncated conical shape in exterior view. The apparatus main body 120 has a cross section 120A with a large diameter in which the mounting board 100 and the cover 130 are installed, and a cross section 120B with a small diameter. The apparatus main body 120 is made of, for example, aluminum or the like having favorable heat conductivity. The mounting board 100 is installed in the cross section 120A of the apparatus main body 120 using well-known installation means (here, screws). In addition, the apparatus main body 120 is provided with a through-hole 120X which penetrates between the cross section 120A and the cross section 120B. Wires 160 which are electrically connected to the light emitting elements 70 of the light emitting device 2 via the mounting board 100 are disposed in the through-hole 120X. The wires 160 are lead to the cross section 120B side from the cross section 120A side via the through-hole 120X.

The cover 130 formed in an approximately dome shape in exterior view is fixed to the cross section 120A of the apparatus main body 120 by an adhesive such as a silicon resin such that the inside of the cover 130 is in an airtight state. In addition, the cover 130 is made of, for example, hard glass.

The holder 140 is made of, for example, a polybutylene terephthalate (PBT) resin or a polyethersulfone (PES) resin. The holder 140 is installed in the cross section 120B of the apparatus main body 120 using well-known installation means (an adhesive, a screw, or the like). A socket (not shown) is fitted to the holder 140. The lighting circuit 150 is accommodated inside the holder 140 and the socket. For example, a circuit board (not shown) of the lighting circuit 150 on which circuit components are mounted is attached to the holder 140. The lighting circuit 150 is a circuit which converts an AC voltage supplied from the socket into a DC voltage, and supplies the DC voltage to the light emitting elements 70 via the wires 160 such that the light emitting elements 70 emit light.

Next, detailed examples where the light emitting device 2 is mounted on the mounting board 100 will be described.

Mounting Example 1 of Light Emitting Device

FIG. 22A shows a cross-sectional view when the light emitting device 2 is mounted on a mounting board 100A.

The mounting board 100A includes a metal plate 101, an insulating layer 102 formed on the upper surface of the metal plate 101, and a wiring pattern 103 formed on the upper surface of the insulating layer 102. As a material of the metal plate 101, a metal with favorable heat conductivity such as, for example, aluminum and copper may be used. As a material of the insulating layer 102, for example, an insulating resin such as a polyimide resin or an epoxy resin, or a resin material where a filler such as silica or alumina is mixed with the resin may be used. As a material of the wiring pattern 103, for example, copper or a copper alloy may be used.

An opening 102X which exposes a part of the metal plate 101 as a mounting region of the light emitting device 2 is formed in the insulating layer 102. In addition, the light emitting device 2 is mounted in the mounting region, that is, on the metal plate 101 exposed from the opening 102X. Specifically, in the light emitting device 2, the heat sink 10 formed on the lower surface thereof is thermally bonded onto the metal plate 101 by a heat conduction member 104. In addition, the heat conduction member 104 may use, for example, a heat conduction member where a high heat conductivity substance such as, for example, indium (In), silicon (or hydrogen carbide) grease, a metal filler, or a graphite is formed in a sheet-shape with a resin binder.

In addition, the external connection terminal pads 41P of the light emitting device 2 mounted on the mounting board 100A are electrically connected to the wiring patterns 103 of the mounting board 100A via spring-like connection terminals 105 (in this embodiment, lead pins).

According to this structure, since the heat sink 10 of the light emitting device 2 is bonded onto the metal plate 101 of the mounting board 100A, heat generated from the light emitting device 2 can be dissipated to the metal plate 101.

Mounting Example 2 of Light Emitting Device FIG. 22B shows a cross-sectional view illustrating a state that the light emitting device 2 is mounted on a mounting board 100B.

The mounting board 100B includes a metal plate 111, an insulating layer 112 formed on the upper surface of the metal plate 111, and a wiring pattern 113 formed on the upper surface of the insulating layer 112. As a material of the metal plate 111, a metal with favorable heat conductivity such as, for example, aluminum and copper may be used. As a material of the insulating layer 112, for example, an insulating resin such as a polyimide resin or an epoxy resin, or a resin material where a filler such as silica or alumina is mixed with the resin may be used. As a material of the wiring pattern 113, for example, copper or a copper alloy may be used.

The light emitting device 2 is mounted on the wiring pattern 113. Specifically, in the light emitting device 2, the heat sink 10 formed on the lower surface thereof is thermally bonded onto the wiring pattern 113 by a heat conduction member 114. In addition, the heat conduction member 114 may use, for example, a heat conduction member where a high heat conductivity substance such as, for example, indium, silicon (or hydrogen carbide) grease, a metal filler, or a graphite is formed in a sheet shape with a resin binder.

In addition, the external connection terminal pads 41P of the light emitting device 2 mounted on the mounting board 100B are electrically connected to the wiring patterns 113 of the mounting board 100B via bonding wires 115.

According to this structure, since the heat sink 10 of the light emitting device 2 is thermally bonded to the wiring pattern 113 via the heat conduction member 114, heat generated from the light emitting device 2 can be dissipated to the metal plate 111 from the heat sink 10 via the wiring pattern 113 and the insulating layer 112. In other words, the wiring pattern 113 which is thermally bonded to the heat sink 10 of the wiring patterns 113 functions as a wiring layer for heat dissipation. In addition, in this mounting example, an opening for exposing the metal plate 111 is not formed in the insulating layer 112; however, in a case where the insulating layer 112 is thin, heat generated from the light emitting device 2 can be dissipated to the metal plate 111 via the insulating layer 112.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A wiring substrate comprising:
   a heat sink;
   an insulating layer on the heat sink;
   first and second wiring patterns on the insulating layer to be separated from each other at a certain interval;
   a first reflective layer comprising a first opening on the insulating layer so as to cover the first and second wiring patterns, wherein a portion of the first and second wiring patterns is exposed from the first opening, and wherein the portion of the first and second wiring patterns, which is exposed from the first opening, is defined as a mounting region on which a light emitting element is to be mounted; and
   a second reflective layer on the insulating layer, wherein the second reflective layer is interposed between the first and second wiring patterns,
   wherein a thickness of the second reflective layer is smaller than that of the first reflective layer.

2. The wiring substrate of claim 1, further comprising:
   a metal layer on the portion of the first and second wiring patterns which is exposed from the first opening, and
   wherein a minimum distance between an upper surface of the second reflective layer and a surface of the insulating layer is smaller than a minimum distance between an upper surface of the metal layer and the surface of the insulating layer.

3. The wiring substrate of claim 1, wherein
   a minimum distance between an upper surface of the second reflective layer and a surface of the insulating layer is smaller than a minimum distance between an upper surface of the wiring pattern and the surface of the insulating layer.

4. The wiring substrate of claim 1, wherein, when the light emitting element is flip-chip mounted in the mounting region on the wiring substrate, a minimum distance between an upper surface of the first reflective layer and a surface of the insulating layer is higher than a minimum distance between a surface of the light emitting element facing the first and second wiring patterns and the surface of the insulating layer.

5. The wiring substrate of claim 1, wherein the first reflective layer further comprises:
   a second opening, wherein only a portion of the second wiring pattern is exposed from the second opening, and the exposed portion of the second wiring pattern is defined as external connection terminal pad.

6. A light emitting device comprising:
   the wiring substrate of claim 1;
   a light emitting element mounted on the wiring substrate; and
   an encapsulating resin that encapsulates the light emitting element.

7. A method of manufacturing a wiring substrate, the method comprising:

(a) providing a heat sink on which an insulating layer is formed;

(b) forming first and second wiring patterns on the insulating layer so as to be separated from each other at a certain interval;

(c) forming a first reflective layer comprising a first opening on the insulating layer so as to cover the first and second wiring patterns such that a portion of the first and second wiring patterns is exposed from the first opening, wherein the portion of the first and second wiring patterns, which is exposed from the first opening, is defined as a mounting region on which a light emitting element is to be mounted; and (d) forming a second reflective layer on the insulating layer such that the second reflective layer is interposed between the first and second wiring patterns, and wherein a thickness of the second reflective layer is smaller than that of the first reflective layer.

8. The method of claim 7, wherein step (c) comprises forming the first reflective layer on the insulating layer using a screen printing method, and step (d) comprises forming the second reflective layer on the insulating layer using a screen printing method.

9. The method of claim 7, wherein step (d) comprises:

(i) forming the second reflective layer having the same thickness as the first reflective layer on the insulating layer; and (ii) thinning the second reflective layer.

10. The method of claim 9, wherein step (ii) of step (d) comprises thinning the second reflective layer through a blast process until an upper surface of the second reflective layer is lower than upper surfaces of the first and second wiring patterns.

11. The method of claim 7, further comprising:

(e) forming a metal layer so as to cover a portion of the first and second wiring patterns corresponding to the mounting region on which the light emitting element is to be mounted, before steps (c) and (d).

12. The method according to claim 7, wherein step (b) comprises:

(i) forming the first and second wiring layers, feed lines for electrolytic plating, and connection portions for connecting the first and second wiring patterns to the feed lines, on the insulating layer, wherein the method further comprises:

(e) forming a metal layer so as to cover a portion of the first and second wiring patterns corresponding to the mounting region on which the light emitting element is to be mounted, through an electrolytic plating method using the first and second wiring layers as a feed layer; and (f) removing at least one of the feed lines and the connection portions after step (e).

* * * * *